United States Patent
Andersson Ersman et al.

(10) Patent No.: US 8,810,888 B2
(45) Date of Patent: Aug. 19, 2014

(54) ELECTROCHEMICAL DEVICE

(75) Inventors: Peter Andersson Ersman, Finspång (SE); David Nilsson, Vikingstad (SE); Magnus Berggren, Vreta Kloster (SE); Per-Olof Svensson, Norrköping (SE); Nathaniel D. Robinson, Kolmården (SE)

(73) Assignee: Acreo Swedish ICT AB, Kista (SE)

( * ) Notice: Subject to any disclaimer, the term of this patent is extended or adjusted under 35 U.S.C. 154(b) by 226 days.

(21) Appl. No.: 13/500,039

(22) PCT Filed: Oct. 5, 2010
(Under 37 CFR 1.47)

(86) PCT No.: PCT/EP2010/064818
§ 371 (c)(1),
(2), (4) Date: Aug. 31, 2012

(87) PCT Pub. No.: WO2011/042430
PCT Pub. Date: Apr. 14, 2011

(65) Prior Publication Data
US 2013/0128332 A1    May 23, 2013

Related U.S. Application Data

(60) Provisional application No. 61/272,544, filed on Oct. 5, 2009.

(30) Foreign Application Priority Data

Oct. 5, 2009  (EP) .................................. 09172227

(51) Int. Cl.
*G02F 1/153*    (2006.01)

(52) U.S. Cl.
USPC ........... 359/270; 359/265; 359/268; 359/269; 359/273; 359/274

(58) Field of Classification Search
USPC .................................. 359/265–275
See application file for complete search history.

(56) References Cited

U.S. PATENT DOCUMENTS 5,206,756 A * 4/1993 Cheshire ................. 359/270
6,193,912 B1 * 2/2001 Thieste et al. ............ 359/265
(Continued)

FOREIGN PATENT DOCUMENTS

JP  2006-030820 A    2/2006
JP  2007-214326 A    8/2007
(Continued)

OTHER PUBLICATIONS

Bartlett, P., et al. (2000) "Microelectrochemical enzyme transistors" Chem. Commun., p. 105-112.
(Continued)

*Primary Examiner* — Evelyn A. Lester
(74) *Attorney, Agent, or Firm* — Harness, Dickey & Pierce, P.L.C.

(57) ABSTRACT

An embodiment of the present invention relates to electrochemical devices including an electrochemically active layer having the ability of electrochemically altering its redox state. By providing a portion of an electrode of corrosion resistant material between an electrolyte and an electrochemically active layer, undesired discoloration due to the electrochemical reaction of an electrochemical device is reduced.

22 Claims, 8 Drawing Sheets

(56) References Cited

U.S. PATENT DOCUMENTS

| | | | |
|---|---|---|---|
| 6,642,069 B2 | 11/2003 | Armgarth et al. | 438/22 |
| 6,747,779 B1* | 6/2004 | Morin et al. | 359/265 |
| 7,012,306 B2 | 3/2006 | Armgarth et al. | 257/355 |
| 2004/0218346 A1* | 11/2004 | Takeuchi et al. | 359/265 |
| 2006/0285190 A1* | 12/2006 | Agrawal et al. | 359/265 |
| 2007/0138463 A1 | 6/2007 | Herlogsson et al. | 257/40 |
| 2008/0074724 A1* | 3/2008 | Agrawal et al. | 359/265 |
| 2009/0090907 A1 | 4/2009 | Kugler et al. | 257/40 |
| 2010/0173195 A1* | 7/2010 | Mizuta et al. | 429/207 |

FOREIGN PATENT DOCUMENTS

| | | | | |
|---|---|---|---|---|
| WO | WO 2005/027599 | 3/2005 | | H05K 3/04 |
| WO | WO 2006/085258 | 8/2006 | | G02F 1/15 |
| WO | WO 2006/097566 | 9/2006 | | H01L 51/20 |
| WO | WO 2007/043419 | 4/2007 | | H01L 29/786 |
| WO | WO 2008/066458 | 6/2008 | | H01L 51/00 |

OTHER PUBLICATIONS

Chen, M. (2005) "Printed electrochemical devices using conducting polymers as active materials on flexible substrates" Proceedings of the IEEE, vol. 93, No. 7, pp. 1339-1347.

Mabeck, J., et al. (2005) "Microfluidic gating of an organic electrochemical transistor" Applied Physics Letters, 87, pp. 013503-1-013503-3.

Nilsson, D., et al. "The electrochemical transistor and circuit design considerations" ITN, Linkoping Universitet, Linkoping. Sweden, Conference Pubhcat3oris, vol. 3, pp. III/349-III/352, Date of Conference Aug. 28-Sep. 2, 2005.

Nilsson, D., et al. (2002) "Bi-stable and dynamic current modulation in electrochemical organic transistors" Advanced Materials, vol. 14, No. 1, pp. 51-54.

Panzer, M., et al. (2006) "High carrier density and metallic conductivity in poly(3-hexylthiophene) achieved by electrostatic charge injection" Advanced Functional Materials, vol. 16, No. 8, pp. 1051-1056.

Panzer, M., et al. (2007) "Polymer electrolyte-gated organic field-effect transistors: Low-voltage, high-current switches for organic electronics and testbeds for probing electrical transport at high charge carrier density" Journal of the American Chemical Society, vol. 129, No. 20, pp. 6599-6607.

European Search Report for EP 09 17 2227 with a mail date of Mar. 26, 2010.

International Search Report for PCT/EP2010/064818 with a mail date of Jan. 4, 2011.

International Preliminary Report on Patentability for PCT/EP2010/064818 with a mail date of Feb. 17, 2012.

Office Action dated Feb. 24, 2014 issued in Chinese Application No. 201080044527.4—English Translation Only.

\* cited by examiner

ELECTROCHEMICAL DEVICE

This application is the national phase under 35 U.S.C. §371 of PCT International Application No. PCT/EP2010/064818 which has an International filing date of Oct. 5, 2010, which claims priority under 35 U.S.C. §119 to European Patent Application No. 09172227.2, filed on Oct. 5, 2009, and claims priority under 35 U.S.C. §119 and/or 120 to U.S. Provisional Application No. 61/272,544, filed on Oct. 5, 2009. The contents of each application recited above are incorporated herein by reference in their entirety.

FIELD OF THE INVENTION

The present invention relates to electrochemical devices, and in particular to electrochemical devices comprising an electrochemically active element having the ability of electrochemically altering its redox state.

BACKGROUND ART

In the field of printable electronics there are electrochemical devices with many different fields of application, such as electrochromic displays and electrochemical transistors. The electrochemical devices involve electrochemically active material and electrolyte, and are typically based on layered structures having lateral or vertical architectures which allow for manufacturing by means of conventional printing techniques. The various fields of application of these types of electrochemical devices relates to e.g. optical, electrical, and/or volumetric properties and effects, wherein the device and its application is controllable by altering the electrochemical state of the device. In other words, the electrochemical devices, and the effects, are controllable by electrochemical switching which may be achieved, for example, by applying a potential difference between the electrochemically active material and the electrolyte. Also, the effects of a device may be controlled in order to define various electrochemical devices with various operations and applications. For example, the above described electrochemical devices find application in the field of printed electronics ranging from sensors and single pixel devices to logic circuits and large active matrix addressed display systems.

U.S. Pat. No. 6,642,069 describes an electrochemical pixel device which includes two components each comprising an electrochemical device. The first component, an electrochemical transistor, is in the electrochemical pixel device arranged to control the second component, an electrochromic display element. The configuration and application of the device gives rise to an electrochemical reaction in the electrochemical transistor, wherein the redox state of the transistor controls the progress of an electrochemical coloring or de-coloring of the electrochromic display element. In more detail, by applying a potential difference between a gate electrode and the transistor channel, the electrochemical redox state of a transistor channel of the transistor is changed due to a controlled electrochemical reaction. The change of redox state of the transistor channel further changes the conductivity of the transistor channel, and by controlling the conductivity of the transistor channel, the redox state and the progress of an electrochemical reaction in the electrochromic pixel element is controllable, which allow for coloring or de-coloring operation of the pixel. Hence, by controlling the electrochemical switching of the transistor channel, the electrochemical switching of the pixel element is controlled and achieved so as to switch it between a colored and non-colored state. General properties, such as switch time and delay time, of the electrochemical reaction in the transistor channel and in the pixel element determine the performance of the device and the finished product. As described, the electrochemical switching of the electrochemical device entails electrochemical reactions, wherein the electrochemical reactions comprise transportation of ionic charges. The above described properties of the electrochemical switching give rise to that the typical switching characteristics of an electrochemical device is disadvantageous in terms of switch time and that the electrochemical device is susceptible to discoloration related to the electrochemical reactions. Moreover, the electrochemical devices may show switching characteristics which are dependent on if the device is switched from a low reacted state to a high reacted state, and vice versa, which further burdens the performance of the device.

SUMMARY OF THE INVENTION

The object of the present invention is to eliminate or at least to alleviate the above mentioned drawbacks and to provide an improved electrochemical device with improved switching characteristics and that is suitable for manufacturing with printing techniques.

These and other objects are met by the subject matters provided in the independent claims. Preferred embodiments of the invention are presented in the dependent claims.

According to a first aspect thereof, the present invention relates to an electrochemical device comprising a layer of solidified electrolyte, at least one electrochemically active layer, wherein each active layer comprises organic material having the ability of electrochemically altering its redox state, and each one of the at least one active layer comprises a contact portion in direct contact, or ionic contact, with the solidified electrolyte. Furthermore, one of the at least one active layer further comprises a first covered portion which extends from the contact portion, and wherein the solidified electrolyte covers, or extend across, the covered portion and the contact portion. The electrochemical device further comprises a first electrode in electronic contact, or in direct electronic contact, with a first region of one of the at least one active layer, and a second electrode in electronic contact, or in direct electronic, contact with a second region of one of the at least one active layer, wherein a first portion and second portion of the second electrode, which portions may be adjacent each other, comprise corrosion resistant material. Moreover, only the first portion of the first and second portion of the second electrode is in direct contact with the solidified electrolyte, and the first portion of the second electrode is arranged between the first covered portion and the solidified electrolyte.

The present invention is based on a realization by the inventors that by providing an electrode, comprising a corrosion resistant material, in contact with an active layer of an electrochemical device, wherein a portion of the electrode is arranged between a solidified electrolyte and the active layer, the electrochemical switching characteristics of the electrochemical device are improved. The present invention is further advantageous in that an undesired discoloring of the electrochemical device, due to the electrochemical reaction occurring to the side of the solidified electrolyte, is reduced. This may be achieved both during and between different electrochemical switching events of the device. In other words, the electrochemical switching of the device is improved and undesired discoloring, which may negatively affect the coloring and/or switching of the electrochemical device, is minimized. In addition, a separate corrosion resistant, or inert, electrode having a higher conductivity, and which is arranged between the active layer and the solidified electrolyte, is capable of limiting spreading of electrochemical reaction outside the electrolyte covered portion of the electrochemically active layer during, or between, electrochemical switching of the device. Moreover, switch characteristics which are less dependent on if the electrochemical device is switched from a first state to second state compared to if the device is switched from the second state to the first state, may be realized.

According to an exemplifying embodiment of the present invention, an electrochemical device comprising a layer of solidified electrolyte, an electrochemically active layer comprising organic material having the ability of electrochemically altering its redox state, and which active layer comprises a contact portion in direct contact with the solidified electrolyte and a first covered portion which extends from the contact portion, is provided. The electrochemical device further comprises a first electrode in electronic contact, or in direct electronic contact, with a first region of the active layer and a second electrode in electronic contact, or in direct electronic contact, with a second region of said active layer. Furthermore, a first portion and second portion of the second electrode comprise corrosion resistant material, wherein only the first portion of the first and second portion of the second electrode is in contact with the solidified electrolyte, and is arranged between the first covered portion and the solidified electrolyte.

According to another exemplifying embodiment of the present invention, an electrochemical device comprising a layer of solidified electrolyte, a first and a second electrochemically active layer comprising organic material having the ability of electrochemically altering its redox state, is provided. Furthermore, the first and second active layer are spatially separated from each other and each comprises a respective first and second contact portion in direct contact with said solidified electrolyte. Moreover, the second active layer further comprises a covered portion which extends from the second contact portion. The electrochemical device further comprises a first electrode in electronic contact, or in direct electronic contact, with a first region of the first active layer, and a second electrode in electronic contact, or in direct electronic contact, with a second region of the second active layer. Furthermore, a first portion and second portion of the second electrode both comprise corrosion resistant material, wherein only the first portion of the first and second portion of the second electrode is in direct contact with the solidified electrolyte, and wherein the first portion of the second electrode is arranged between said covered portion and said solidified electrolyte.

According to one embodiment of the present invention, the electrochemical device is arranged on a flexible substrate, or carrier, which allows for an electrochemical device which is flexible, and may find various advantageous applications, for example where the device is subjected to external stresses, such as various bending or stretching actions. Furthermore, a flexible substrate, or carrier, facilitates the manufacturing of the electrochemical device. In an embodiment, the electrochemical device is arranged on a flexible substrate, or carrier, and arranged for manufacturing by conventional printing techniques, for example by using a reel-to-reel manufacturing apparatus.

According to one embodiment, the second electrode of the device is elongated and extends in a first direction. Accordingly, an elongated second electrode comprises an electrode having a first length along a first direction, and a second length along a second substantially orthogonal direction, wherein the first length is longer than the second length. An elongated, or bandshaped, second electrode allows for a simple architectural configuration of the electrochemical device which is advantageous in that the alignment requirements of the device during manufacturing are low. The manufacturing is also facilitated by an elongated electrode due to easy application for example during continuous manufacturing or during conventional printing manufacturing, wherein the electrode is simple to apply to the device such that a portion is arranged between the active layer which comprises the first covered portion and the electrolyte. According to an embodiment comprising an elongated second electrode, the second electrode is bandshaped and extends in at least one direction outside, or beyond, the covered portion, or a first projecting portion, of the active layer, wherein bandshape may involve a rectangular shape or the shape of a thin strip, such as a thin line. Moreover, an elongated or bandshaped second electrode is advantageous in that the device is suitable for configuration with other electrical or electrochemical components of a circuit arrangement, or for configuration and connection with other electrodes or electrode nodes.

According to one embodiment of the invention, the width of the second electrode is at least 1%, or at least 5%, of the width of the active layer which comprises the first covered portion in a cross-section of the electrochemical device taken along a second direction, wherein the second direction is orthogonal to the first direction as defined by the extension of the second electrode and explained above. The second electrode may also be of various widths relative the active layer, such as from about 1% up to about 95%, or, alternatively, of a width that is larger than the width of the active layer. The second electrode advantageously provides improved conductivity compared to the electrochemically active layer which allows for faster switching of the electrochemical device. In addition, a separate corrosion resistant, or inert, second electrode having a higher conductivity, and which is arranged between the active layer and the solidified electrolyte, is capable of limiting spreading of electrochemical reaction outside the electrolyte covered portion of the electrochemically active layer during, or between, electrochemical switching of the device. A higher conductivity of second electrode compared to the active layer also allows for an improved application of a potential difference to the active layer.

In general, an increased width of the second electrode relative the active layer, at the covered portion of said layer, provides a lowered switch time of the electrochemical device. A reduced width of the second electrode relative the active layer, at the covered portion, improves the redox states of the electrochemical device, which for example provides for that the off-currents of a transistor device based on the electrochemical device may be reduced, or that the color contrast of a electrochromic pixel device based on the electrochemical device may be increased. Hence, desired effects of the electrochemical device may be achieved by selecting a width of the second electrode relative the electrochemically active layer which comprises the first covered portion, which width e.g. provides the best balance between switch time and off-current. Typically, the width of the second electrode may be limited by the utilized manufacturing, or printing, technique, but may be provided with an arbitrary small width.

According to another embodiment, in the abovementioned cross-section, the width of the second electrode is at least 1%, at least 5%, or about 95%, of the width of the solidified electrolyte. Hence, the solidified electrolyte covers the second electrode in the cross-section which facilitates the application of the solidified electrolyte and of the second electrode. Alternatively, the width of the second electrode is more than 100% of the width of the solidified electrolyte. In yet an embodiment, in the cross-section, the width of the solidified electrolyte is smaller than the width of said second electrode, Hence, it is allowed for that the second electrode may be applied, or printed, with low precision. Furthermore, the alignment requirements on the second electrode are thereby low in the second direction.

Accordingly, when a first element of the device is of narrower dimension relative a second element in the second direction, such elements as the active layer, second electrode, the electrolyte, etc., as described in abovementioned embodiments, the narrow first element may be arranged such that it does not extend outside the second element. Alternatively, the first element and second element may be arranged, or printed, such that a portion of the first element extends outside the second element in the second direction. In other words, non-aligned, or an off-set, relative arrangement of two elements of the electrochemical device may be provided, for example for achieving an intended area of an electrochemically active region, or an electric contact area even smaller than the resolution of the printing technique would allow.

In yet an embodiment of the present invention, the abovementioned cross-section, which is taken along a second direction, wherein the second direction is orthogonal to the first direction as defined by the elongated shape of the second electrode, comprises the second portion of the second electrode. The cross-section may further be taken adjacent an interface between the first and second portion of the second electrode, wherein the first portion and second portion of the second electrode are adjacent, the first portion extends from the second portion, or the first portion is arranged immediately at the second portion of the second electrode. Thus, the cross-section is taken in the second portion of the second electrode and immediately at the interface of the first and second portion of the second electrode. In other words, the cross-section may be taken in the second portion of the second electrode in a portion immediately neighboring the first portion of the second electrode. Advantageously, and as described in different embodiments above, the second electrode is provided with a width relative the active layer, or solidified electrolyte, in a region adjacent electrochemical activity during, or between, electrochemical switching of the device, which allows for improved switch time of the electrochemical device between difference redox states, improved durability of the electrochemical device, and partial limitation of transportation of ionic charges from the electrochemically active region to undesired regions is achieved. For example, one such undesired region may be, in the active layer, outside the contact portion or the interface area between the active layer and the solidified electrolyte. The abovementioned embodiments are further advantageous in that simple architectural designs of the device, e.g. suitable for printing manufacturing, are realized.

In one embodiment, the active layer which comprises the first covered portion, or simply the covered active layer, further comprises a first projecting portion which extends from said first covered portion and/or extends outside the solidified electrolyte. The covered portion is arranged between and in direct contact with the contact portion and the first projecting portion, and the second portion of the second electrode at least partly covers the first projecting portion. The projecting portion of the active layer may, in a projection normal to the layer of solidified electrolyte, extend outside, or beyond, the solidified electrolyte. The first projecting portion provides an extended active layer and the second electrode may be applied, or printed, to partly cover the first projecting portion, which facilitates a layered manufacturing of the second electrode wherein manufacturing alignment requirements may be further reduced. In other words, in the embodiment, the covered active layer comprises an extending portion, the first projecting portion, which is partly covered by the second electrode. Accordingly, the second electrode may be arranged to the side of and in an overlapping arrangement with the active layer, wherein the second portion of the second electrode overlaps an extending portion of the covered active layer, that is the first projecting portion, and wherein the first portion of the second electrode further overlaps the covered portion of the covered active layer and is arranged between, or sandwiched between, the solidified electrolyte and the covered active layer.

Advantageously, in an embodiment of the invention, the second electrode is arranged such that the first portion of the second electrode enclose an open area, or an contact area, which defines an interface between the solidified electrolyte the said covered active layer, i.e. the active layer which comprises the first covered portion. Accordingly, the second electrode may be applied to the active layer and have a shape comprising an open area that do not cover the active layer, and, at least partly, enclosing the contact portion of the active layer. This allows for the solidified electrolyte to be in ionic contact with the active layer in a region at least partly defined by the contact area enclosed by the first portion of the second electrode. Therefore, the enclosed area, or contact area, provided by the second electrode, in one or more directions, defines the extension of the interface area between the solidified electrolyte and the active layer. Hence, the second electrode may advantageously be formed and shaped in order to achieve a suitable shape of the interface area of the active layer and the electrolyte. For example, electrochemically active pixel elements comprising an embodiment of the electrochemical device with various designs of the second electrode and the interface area may be realized.

According to one embodiment of the invention, the second electrode is arranged as a layer which allows for a simple device architecture which enables simple and efficient manufacturing. For example, printing application of the second electrode is facilitated if the second electrode is arranged as a layer and the alignment requirements are typically only dependent on the width and length of the second electrode. The electrochemical device may further be arranged in a vertical or lateral layered arrangement.

In general, a vertical arrangement of the device is typically arranged such that the electrolyte interface area of at least two separated active layers are in a direction facing each other. For example, the solidified electrolyte layer may be sandwiched between a first active layer and a second active layer, or sandwiched between a first active layer and the first, or a third, electrode, wherein the first active layer and the second active layer, or the first active layer and the first, or the third electrode, respectively, are stacked. Hence, in a lateral arranged of the device, the separated first and the second active layers are typically arranged in a side by side arrangement, wherein the electrolyte is arranged on the device such that the electrolyte interface area faces the same direction. In other words, the electrolyte interface areas of, for example, the first and second active layers are located on different sides of the electrolyte in the vertical arrangement, and located on the same side of the electrolyte in the lateral arrangement.

By providing a second electrode according to the present invention, and as described in abovementioned embodiments, the electrochemical device is advantageous in that improved switching, wherein one of the at least one active layer switches between different redox states, is realized. Typically, improved switching, such as faster switching times, may be provided. According to one example, in electrochemical devices provided with a number of electrodes, only one electrode of corrosion resistant, or inert, material and having a portion arranged between the covered portion and the solidified electrolyte, is provided. In other words, only one electrode of the electrochemical device is arranged as the second electrode according to the present invention. In particular, this is advantageous in that the switching characteristics of the electrochemical device are improved in terms of response times, or switching times, which are independent of if the electrochemical device is switched from a first state to a second state, or vice versa. Hence, having only one electrode arranged as the second electrode allow for optimized electrochemical devices which have equal, or corresponding, switch characteristics when the electrochemical device is switch e.g. from an oxidized state to a reduced state, or from a reduced state to a oxidized state. The electrochemical device may also be switched to a redox intermediate state.

According to an alternative embodiment, the electrochemical device may be arranged with two, or more, electrodes which are arranged as the second electrode according to the present invention. That is, the electrochemical device is equipped with two, or more separate electrodes, which comprise corrosion resistant material and are arranged with a respective portion between solidified electrolyte and an electrochemically active layer.

Hence, an electrochemical device is provided, wherein one of the at least one electrochemically active layer comprises a second covered portion, which second covered portion extends from the contact portion of the one of the at least one electrochemically active layer. Furthermore, a first portion and a second portion of the first electrode comprise corrosion resistant material, wherein only the first portion of the first and second portion of the first electrode is in contact, or in direct contact, with the solidified electrolyte, and wherein the first portion of the first electrode is arranged between the second covered portion and the solidified electrolyte. Providing the above described first electrode may be advantageous in that the application of a potential difference to the first region of one of the at least one active layer is facilitated, and that the switch characteristics of the electrochemical device may be further alternated. In an embodiment, the electrochemical device comprises one active layer which is provided with solidified electrolyte and a first and second electrode which are separate, wherein both the first and second electrode are arranged with a first and second portion, respectively, and wherein each first portion of the first and second electrodes is arranged between contact portions of the active layer and the solidified electrolyte. Alternatively, the electrochemical device may comprise two separate active layers, that is a first and second active layer, which first active layer is arranged with the first electrode and which second active layer is arranged with the second electrode, respectively, and which active layers each is in direct contact with the solidified electrolyte.

Advantageously, the corrosion resistant material which is used for at least portions of e.g. the second electrode of the electrochemical device, is selected from a group comprising suitable materials which are electrically conducting. In an embodiment, the corrosion resistant material comprises material, or combinations of materials, which is electrically conductive but ionically non-conductive, electrochemically non-active, and/or has a different electrochemical potential compared to the active layer and in relation to the electrolyte. For example, the corrosion resistant material is selected from a group comprising carbon, gold, titanium, platinum, a conducting form of carbon, graphite, graphene, noble metal, or inert metal.

In an embodiment of the invention, the organic material comprises a conductive polymer material which allows for that a polymer based electrochemical devices can be realized. Conductive polymer further provide for conventional polymer printing techniques along with deposition techniques during manufacturing of the electrochemical device, wherein design and the techniques may easily be scaled up and utilized at low cost. A conductive polymer material further allows for simple application of a voltage, or potential differences, to the electrochemical device since the device itself may be utilized as electrode portions. In particular, the active layer and the first electrode may be comprised of a polymer material in contact with the solidified electrolyte, wherein the active layer and the first electrode may form a continuous element, and wherein the first electrode is defined as a portion of the active layer not in contact, or covered, by solidified electrolyte.

In an embodiment of the present invention, the active layer which comprises the first covered portion, or, for reasons of simplicity, the covered active layer, further comprises material having the ability of electrochemically altering its electrical conductivity through change of redox state. By changing the redox state of covered active layer the electrical resistance of the material is altered which allows for various of field of application of the electrochemical device. The redox state may by altered by applying a potential difference between the first, the second, or more electrodes of the device such that a electrochemical reaction is generated in the covered active layer in combination with the solidified electrolyte. In turn, the electrochemical reaction alters the conductivity of the covered active layer. For example, varying conductive functionality allows for use of the electrochemical device as an electrochemically based electrical device, such as a transistor or resistor, as described in the article Bi-stable and Dynamic Current Modulation in Electrochemical Organic Transistors, by D. Nilsson, et al., published in Adv. Mater. 2002, 14, No 1, January 4.

According to an embodiment, the electrochemical device forms an electrochemical transistor device, wherein the first region and the second region are two separate regions of the covered active layer, i.e. the active layer which comprises the first covered portion. In the transistor embodiment, the electrochemical device further comprises a third electrode in ionic contact with the solidified electrolyte and separated from the covered active layer, and the covered active layer electronically connects the first and second electrodes. The covered active layer further comprises material having the ability of electrochemically altering its electrical conductivity through change of redox state. Hence, the covered active layer connects the first and second electrode such that the electrical resistance between the first and second electrodes is controllable by changing the redox state of the covered active layer. For instance, the third electrode is in contact with the electrolyte and may act as a gate electrode in the transistor device. For example, in an embodiment, a potential difference applied between the third electrode, or the gate electrode, and at least one of the first and second electrodes controls an electrochemical reaction in the active layer. In turn, the electrochemical reaction alters the redox state and the conductivity of the covered active layer, Hence, a current between the first and second electrodes may be controlled by means of a potential difference applied to the third gate electrode. In other words, flow of electrons between the first electrode and the second electrode is controllable by application of a potential difference to the third gate electrode.

The configuration of the corrosion resistant electrode is advantageous in the application of a potential difference is facilitated. For example, the resistance of the electrode arrangement is reduced which provides a more energy efficient device. Hence, the switch characteristics, and switch time of the transistor device is considerably improved. Also, the working life and the durability of the device is improved as the corrosion resistant electrode material counteract electrochemical degradation of e.g. the active layer. Typically, suitable potential differences, or voltages, are used during operation of the device, wherein too large potential differences may damage e.g. the active layer. Hence, within operational potential differences suitable for the electrochemical device, the arrangement of the corrosion resistant electrode provide for longer life time of the electrochemical device and an improved structural stability. The electrochemical transistor device according to an embodiment of the present invention may further allow for improved switching characteristics, wherein migration, or drift, of the switching electrochemical reaction, which drift may negatively affect the switching of the transistor device, is minimized. By reducing the drift of the electrochemical reaction, ions are restrained from migrating outside the active region of the electrochemically active layer which comprises the covered portion. A drift outside the active region may make the switching slow. Furthermore, the drift may cause a electrochemical redox state in the electrochemical transistor device which is slow, or potentially impossible, to revert. Such slow-switching electrochemical state may occur when ions migrate, or drift, from the active electrochemical reaction area and, therefore, become less affected by any potential difference applied to the electrochemical transistor device. Hence, according to the embodiment of the invention, the switch time of the transistor device is improved and the transistor switch characteristics may be balanced such that the switch time of the transistor device will be less depended on if the device is switched from a conducting to non-conducting state, or from a non-conducting to a conducting state.

The electrochemical device, or the electrochemical transistor device may in an embodiment be arranged as one component in a circuit arrangement, wherein the circuit arrangement may further comprise an electrical power source. In this case, at least the first and the second electrodes of the electrochemical device are electronically connected to said power source which may be utilized for application of a potential difference between the electrodes.

According to yet an embodiment, one of the at least one active layer of the electrochemical device comprises electrochromic material. The electrochromic material may have the ability of electrochemically altering its color through change of redox state of the electrochromic material. Hence, the color of the active layer may be controlled by altering the redox state of the active layer by means of e.g. providing a potential difference to the active layer which generates an electrochemical reaction. The electrochemical device may according to an embodiment form an electrochromic pixel device. The electrolyte may be arranged between a first and second active layer, wherein, in this case, at least one of the first and second active layer is electrochromic. The other active layer, or e.g. the first electrode, may act as a counter electrode. The electrochromic pixel device is advantageous in that the second electrode, according to the present invention, allows for a considerable reduction of undesired discoloration of the pixel device and a considerable reduction of undesired migration, or drift, of an electrochemical reaction front, which reaction front controls the coloring and de-coloring of the pixel element. Without the arrangement of the second electrode according to the present invention, discoloration of the pixel device may occur, wherein the electrochemical reaction front, or ionic charges, in the active layer move away from the electrochemical reaction area which, in turn, affects the redox state and the coloring of the electrochromic material. In addition, the migrated reaction front may hamper the switching of the pixel device between different redox state since the migrated reaction front will have a decreased mobility and will be slow, or potentially impossible, to revert. In certain cases, the migrated electrochemical front may fully consume the electrochemical material such that it become non-switchable. Therefore, according to the embodiment of the invention, an improved pixel device with reduced discoloration, improved switch times and increased working life may be provided.

Definitions

Electrochemically active: an "electrochemically active" layer according to the present invention, is a piece of a material having the ability of electrochemically altering its redox state. The change of redox state may be achieved by oxidation or reduction reactions, for example, by applying a potential difference across the electrochemically active material which has at least a portion in ionic contact with an electrolyte. For example, the electrochemically active material may be a material which has the ability of electrochemically altering its electrical conductivity through change of redox state thereof. The electrochemically active material may also be an electrochromic material which has the ability of electrochemically altering its color through change of redox state thereof, hence the material undergoes a color change as a response to an electrochemical reaction. The properties of the electrochemical material may include abilities related to sensing devices, opto-electronic devices, actuators, wettability switching, and microfluidic devices. The electrochemically active layer may furthermore be arranged with an electrode, being composed of the same or different materials.

Electrochromic: an "electrochromic" layer in relation to this invention is a continuous geometrical body, which can be patterned and/or printed into different shapes, and is composed of one material or a combination of materials. The material(s) may be organic or inorganic, molecular or polymeric. Such an electrochromic element, whether it is composed of one material or is an ensemble of more than one material, combines the following properties: at least one material is electrically conducting in at least one oxidation state, and at least one material is electrochromic, i.e. exhibits color change as a result of electrochemical redox reactions within the material. Optionally, the electrochromic element may comprise an electrochemically active material.

Contact portion: as used herein, a contact portion of an electrochemically active layer is a portion of the layer which surface on at least one side of the layer is in direct contact with electrolyte, i.e. shares a common interface with an electrolyte.

Covered portion: as used herein, a covered portion of an electrochemically active layer is a portion which at least partly is in direct electronic contact with an electrode of corrosion resistant material, which in turn is covered by electrolyte. In other words, the electrode is arranged between the covered portion of the electrochemically active layer and the electrolyte layer. A covered portion may also comprise portions in direct contact with the electrolyte.

Projecting portion: as used herein, a projecting portion of an electrochemically active layer is a portion which at least partly is in direct electronic contact with an electrode of corrosion resistant material, and not covered by electrolyte. In other words, the electrode is arranged in contact with and covering the projecting portion of the electrochemically active layer.

Electrochromic display: an "electrochromic display" is in relation to this invention a device comprising at least one electrochromic pixel element, which pixel element is arranged such that a color change of the electrochromic element is visually detectable in reflection and/or in transmission. In an electrochromic pixel element, the active layer comprises electrochromic material in ionic contact with the electrolyte, and an electrode in contact with the electrolyte which function as a counter electrode. For example, an electrochromic display element may be operated by applying a potential difference between the active layer and the electrode, wherein the potential difference controls an electrochemical reaction. In turn, the electrochemical reaction controls, or results in, the coloring or de-coloring of the pixel element.

Color change: when reference is made to "color change", this is also meant to include changes in optical density or reflectance, so that "color change" for example takes into account changes from blue to red, blue to colorless, colorless to blue, dark blue to light blue, grey to white or dark grey to light grey alike.

Solidified electrolyte: for the purposes of the invention, "solidified electrolyte" means an electrolyte that is solid or semi-solid and which at the temperatures at which it is used is sufficiently rigid that particles/flakes in the bulk therein are substantially immobilized by the high viscosity/rigidity of the electrolyte and that it does not flow or leak. For example, such an electrolyte has the proper rheological properties to allow for application of this material on a support in an integral sheet or in a pattern, for example by conventional printing methods. After deposition, the electrolyte formulation should solidify upon evaporation of solvent or because of a chemical cross-linking reaction, brought about by additional chemical reagents or by physical effect, such as irradiation by ultraviolet, infrared or microwave radiation, cooling or any other such. The solidified electrolyte may for example comprise an aqueous or organic solvent-containing gel, such as gelatin or a polymeric gel. However, solid polymeric electrolytes are also contemplated and fall within the scope of the present invention. Furthermore, the definition also encompasses liquid electrolyte solutions soaked into, or in any other way hosted by, an appropriate matrix material, such as a paper, a fabric or a porous polymer. In some embodiments of the invention, this material is in fact the support upon which the electrochemical device is arranged, so that the support forms an integral part of the electrochemical device.

Electrodes: "electrodes" in devices according to the invention are structures that are composed of an electronically conducting material and may be connected to e.g. a portion of an electrochemically active layer which portion in turn may be in direct contact with the electrolyte. The electrodes of the device is typically used for connecting the device to a power source, or may also be used to connect the device as a component in an electrical circuit, or in connection with other circuit components. Electrodes may be used to facilitate a matrix configuration of a plurality of device, such as an active address matrix configuration of devices. In addition, an electrode may also be composed of the same material or similar material as the active layer and therefore form a continuous, or unitary, piece of material which is electrically conducting and comprise a portion that is in direct contact with the solidified electrolyte. Hence, the electrochemically active material, or layer, may at least partly form an electrode; or a portion of an electrochemically active material may form a portion of an electrode which thereby forms a conductive path to an electrochemically active region of the device. For example, by applying a first electrical potential in an electrode of the device, such as the first electrode of the device, and applying a different potential to the second electrode of the device, a potential difference is provided in the device and the redox state of the electrochemical device may be controlled and switched.

Corrosion resistant material: according to the present invention, corrosion resistant material may comprise material which is suitable to use in combination with the electrochemically active material and may be substantially inert. Corrosion resistant material may for example be selected from a group comprising carbon, gold, titanium, platinum, conducting form of carbon, graphite, graphene, noble metal or inert metal. For example, in the electrochemical device, by forming e.g. an electrode of a material comprising corrosion resistant material having higher electrical conductivity than the electrochemically active material, the configuration of the electrochemical device in circuit systems, such as printed electronic systems, may be facilitated. For example, the electrical conductivity and efficiency of the electrochemical device may be increased, wherein the resistance of the electrodes of the electrochemical device and undesired power losses may be reduced. Furthermore, the corrosion resistant material allows for less degradation of the electrochemical material, such as electrochemical polymers, which results in an increased durability of the electrochemical device and a longer working life, given that applied potential differences are kept within suitable operational limits of the electrochemical device.

Layer: according to some embodiments, the electrochemical device has a laminate structure and consists of "layers" of different materials. These layers can be continuous or patterned, and can be applied to each other (self-supporting device) or to a support or carrier (supported device) which may be flexible. Furthermore, the term layer may encompass all elements of the same material in the same plane, regardless whether this material is patterned or interrupted in such a way as to form discontinuous "islands" in the plane.

Direct electrical contact: Direct physical contact (common interface) between two phases (for example active layer and electrode) that allows for the exchange of charges through the interface. Charge exchange through the interface can comprise transfer of electrons between electrically conducting phases, transfer of ions between ionically conducting phases, or conversion between electronic current and ionic current by means of electrochemistry at an interface between for example active layer and electrolyte or electrolyte and electrochromic element.

Direct electronic contact: Direct physical contact (common interface) between two phases (for example active layer and electrode) that allows for the exchange of electrons through the interface. Charge exchange through the interface can comprise transfer of electrons between electrically conducting phases.

Direct ionic contact: Direct physical contact (common interface) between two phases that allows for electrochemical reactions, such as redox reactions, i.e. reduction or oxidation reactions.

Materials

According to one example, the solidified electrolyte comprises a binder. For example, the binder has gelling properties and is e.g. selected from the group consisting of gelatine, a gelatine derivative, polyacrylic acid, polymethacrylic acid, poly(vinylpyrrolidone), polysaccharides, polyacrylamides, polyurethanes, polypropylene oxides, polyethylene oxides, poly(styrene sulphonic acid), and salts and copolymers thereof; and may optionally be cross-linked. Polymers having quaternary ammonium groups, such as polymers bearing imidazolium groups. Examples are polyquaternium grades, preferably copolymers with quaternized vinylimidazole units, such as Luviquat Excellence provided by BASF. The solidified electrolyte may further comprise an ionic salt, for example magnesium sulphate if the binder employed is gelatine. The solidified electrolyte may further contain a hygroscopic salt such as magnesium chloride to maintain the water content therein.

In embodiments, the electrochemical device comprises, as electrochemically active material, a polymer which may be electrically conducting and/or electrochromic in at least one oxidation state, and optionally also comprises a polyanion compound. Electrochemical polymers for use in the electrochemical device of the invention are for example selected from the group consisting of polythiophenes, polypyrroles, polyanilines, polyisothianaphthalenes, polyphenylene vinylenes and copolymers thereof, such as described by J C Gustafsson et al in Solid State Ionics, 69, 145-152 (1994); Handbook of Oligo- and Polythiophenes, Ch 10.8, Ed D Fichou, Wiley-VCH, Weinhem (1999); by P Schottland et al in Macromolecules, 33, 7051-7061 (2000); by M Onoda in Journal of the Electrochemical Society, 141, 338-341 (1994); by M Chandrasekar in Conducting Polymers, Fundamentals and Applications, a Practical Approach, Kluwer Academic Publishers, Boston (1999); and by A J Epstein et al in Macromol Chem, Macromol Symp, 51, 217-234 (1991). In an embodiment, the polymer is a polymer or copolymer of a 3,4-dialkoxythiophene, in which said two alkoxy groups may be the same or different or together represent an optionally substituted oxy-alkylene-oxy bridge. In yet an embodiment, the polymer is a polymer or copolymer of a 3,4-dialkoxythiophene selected from the group consisting of poly(3,4-methylenedioxythiophene), poly(3,4-methylenedioxythiophene) derivatives, poly(3,4-ethylenedioxythiophene), poly(3,4-ethylenedioxythiophene) derivatives, poly(3,4-propylenedioxythiophene), poly(3,4-propylenedioxythiophene) derivatives, poly(3,4-butylenedioxythiophene), poly(3,4-butylenedioxythiophene) derivatives, and copolymers therewith. The polyanion compound is then preferably poly(styrene sulfonate). As is readily appreciated by the skilled man, in alternative embodiments of the invention, the electrochemical material comprises any non-polymer material, combination of different non-polymer materials, or combination of polymer materials with non-polymer materials, which may exhibit conductivity in at least one oxidation state as well as electrochromic behavior. For example, one could use a composite of an electrically conducting material and an electrochromic material, such as electrically conductive particles such as tin oxide, ITO or ATO particles with polymer or non-polymer electrochromic materials such as polyaniline, polypyrrole, polythiophene, nickel oxide, polyvinylferrocene, polyviologen, tungsten oxide, iridium oxide, molybdenum oxide and Prussian blue (ferric ferrocyanide). As non-limiting examples of electrochemically active material for use in the device of the invention, mention can be made of: a piece of PEDOT-PSS, being both conducting and electrochromic; a piece of PEDOT-PSS with $Fe^{2+}/SCN^-$, PEDOT-PSS being conducting and electrochromic and $Fe^{2+}/SCN^-$ being an additional electrochromic component; a piece composed of a continuous network of conducting ITO particles in an insulating polymeric matrix, in direct electrical contact with an electrochromic WO3-coating; a piece composed of a continuous network of conducting ITO particles in an insulating polymeric matrix, in contact with an electrochromic component dissolved in an electrolyte. According to one embodiment of the present invention, an electrochromic pixel device may comprise a further electrochromic material for realization of displays with more than one color. This further electrochromic material can be provided within the electrochromic pixel element or the solidified electrolyte, which then for example comprises an electrochromic redox system, such as the redox pair of colorless $Fe^{2+}$ and SCN-ions on one hand, and of red $Fe^{3+}$ (SCN)(H2O)5 complex on the other. By way of further, non-limiting example, such materials may be selected from different phenazines such as DMPA-5,10-dihydro-5,10-dimethylphenazine, DEPA-5,10-dihydro-5,10-diethylphenazine and DOPA-5,10-dihydro-5,10-dioctylphenazine, from TMPD-N,N,N',N'-tetramethylphenylenediamine, TMBZ-N,N,N',N'-tetramethylbenzidine, TTF-tetrathiafulvalene, phenanthroline-iron complexes, erioglaucin A, diphenylamines, p-ethoxychrysoidine, methylene blue, different indigos and phenosafranines, as well as mixtures thereof.

The properties of the electrochemical material in the electrochemical device may include abilities related to sensing devices, opto-electronic devices, actuators, wettability switching, and micro fluidic devices. In addition, the electrochemical devices according to the present invention may find various applications in the field of printed electronics, for example ranging from sensors and single pixel devices to logic circuits and large active matrix addressed display systems Generally, other objectives, features, and advantages of the present invention will appear from the following detailed disclosure, from the attached dependent claims as well as from the drawings.

BRIEF DESCRIPTION OF DRAWINGS

Embodiments of the invention will now be described, by way of example, with reference to the accompanying drawings. It should be understood that the drawings are not true to scale, and, as is readily appreciated by a person skilled in the art, dimensions other than those illustrated in the drawings are equally possible within the scope of the invention. It is also to be noted that some details in the drawings may be exaggerated in comparison with other details.

DETAILED DESCRIPTION OF EMBODIMENTS OF THE INVENTION

Figure 1A:
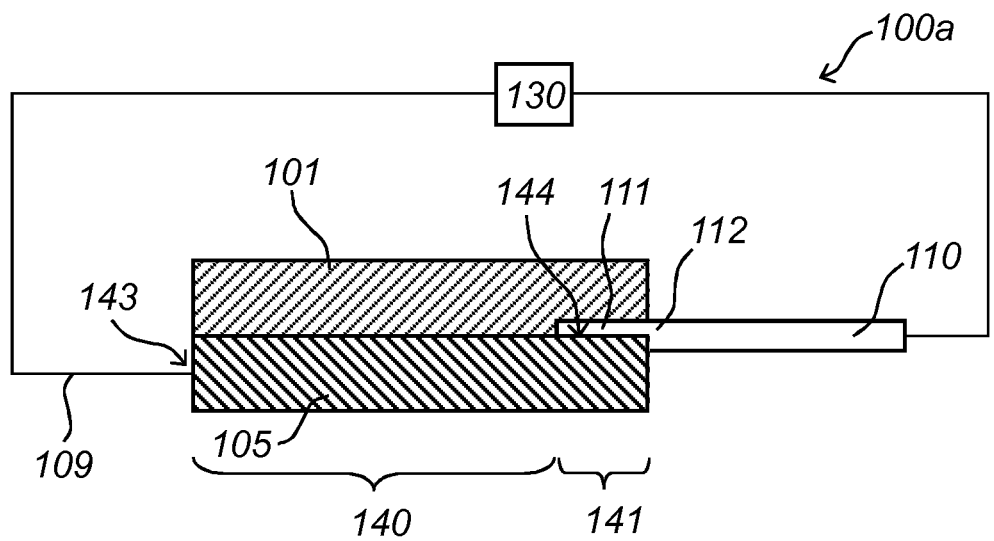
FIG. 1*a-d* are cross-sectional views of embodiments of the electrochemical device according to the present invention.

In the following detailed description, if not mentioned otherwise, the same or corresponding reference numerals indicate similar features, with an adjustment for the figure number. In other words, reference numerals 101, 201, 301, . . . , and 1101 indicate similar features in FIGS. 1a-d, 2a-b, 3, . . . , and 11, respectively, in this case the solidified electrolyte.

FIG. 1a-d are cross-sectional views of embodiments according to the present invention. In FIG. 1a, the electrochemical device 100a comprising an active layer 105 that has the ability of electrochemically altering its redox state, is illustrated. The active layer 105 is comprised of an organic material, for example an electrochemically active polymer material, and is arranged in direct contact, and/or ionic contact with a layer of solidified electrolyte 101.

The solidified electrolyte is in contact with and covers a contact portion 140 of the active layer 105. In more detail, the layer of solidified electrolyte 101 is in ionic contact with the active layer 105 such that an interface area of the active layer is in ionic contact with an interface area of the solidified electrolyte. Hence, the interface area corresponds to, or defines, the contact portion 140 of the active layer 105. In addition, the interface between the solidified electrolyte 101 and electrochemically active material typically defines an electrochemically active region of the electrochemical device, or an active portion of the active layer 105, as the electrolyte covers only a portion of the active layer 105. The active layer 105 further comprises a first covered portion 141 which extends from the contact portion 140 of the active layer 105. The first covered portion 141 is covered by the layer of solidified electrolyte 101, or the solidified electrolyte extends across the covered portion 141 of the active layer 105, without the solidified electrolyte 101 being in contact with the covered portion 141 as electrolyte and the active layer are separated from each other by an electrode 110. A first electrode 109 is schematically illustrated, which first electrode 109 is in electronic contact, or direct electronic contact, with the active layer 105 in a first region 143 of the active layer 105. The first electrode may, for example, be formed of electrodes, such as metal wires or conducting paths, or be formed of the same or similar material as the active layer, such as conducting polymer material. The electrochemical device 100a is further arranged with a second electrode 110 which is in electronic contact, or direct electronic contact, with a first region 144 of the active layer 105, wherein the first and second regions (143, 144) of the active layer 105 are separated, or spatially separated, from each other. The second electrode 110 extends outside the solidified electrolyte, as illustrated, and comprises a first portion 111 and a second portion 112 which both comprise corrosion resistant material, for example a material comprising carbon. The first 111 and second 112 portions of the second electrode 110 are further arranged adjacent each other, and the first portion 111 extends from the second portion 112. As shown, only the first portion 111 of the first and second portions 111, 112 of the second electrode 111 is in direct contact with the solidified electrolyte 101, and the first portion 111 of the second electrode 110 is arranged between the first covered portion 140 of the active layer 105 and the layer of solidified electrolyte 101. In other words, the first portion 111 of the second electrode 110 is arranged between the layer of solidified electrolyte 101 and the active layer, such that the covered portion 141 of the active layer 105 is not in contact with solidified electrolyte 101. The second electrode at least partly comprises corrosion resistant material, such as carbon, and is, as schematically illustrated, connected to a circuit arrangement, controller, or power source, 130, via schematic electrodes.

In other words, FIG. 1a illustrates an electrochemical device 100a comprising a layer of solidified electrolyte 101, and one electrochemically active layer 105, which comprises organic material having the ability of electrochemically altering its redox state, wherein said active layer 105 comprises two portions. A contact portion 140 in direct contact, or direct ionic contact, with the solidified electrolyte 101; and a first covered portion 141 which extends from the contact portion 140, and wherein the solidified electrolyte 101 covers, or extend across, both the covered portion 141 and the contact portion 140. The electrochemical device further comprises a first electrode 109 in direct electronic contact with a first region 143 of one of the active layer 105, a second electrode 110 in direct electronic contact with a second region 144 of the layer. Moreover, a first portion 111 and second portion 112 of said second electrode comprise corrosion resistant material, wherein only the first portion 111 of said first and second portion of the second electrode is in direct contact with the solidified electrolyte 101, and wherein the first portion 111 of said second electrode 110 is arranged between the first covered portion 141 and the solidified electrolyte 101.

Figure 1B:
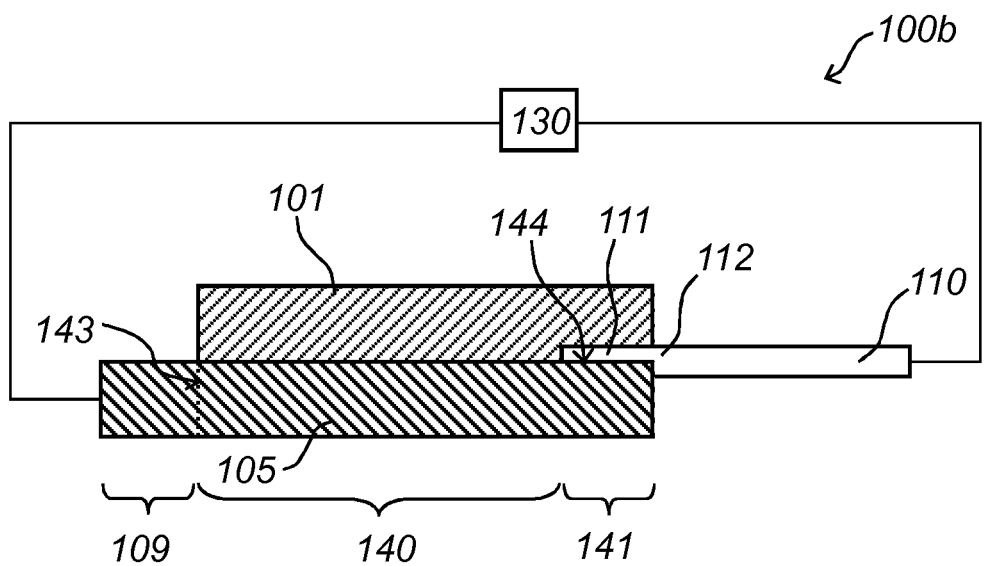

In FIG. 1b, an electrochemical device 100b is illustrated which comprises similar features and have the same arrangement as the electrochemical device 100a, illustrated in FIG. 1a. The electrochemical device 100b in FIG. 1b differs the electrochemical device 100a in FIG. 1a in that the electrochemically active layer 105 of the electrochemical device 100b further comprises a portion 109 which forms a part of the first electrode 109, which further portion 109 is in contact with the contact portion of the active layer 105 at a first region 143. The interface between the first electrode portion 109 and the contact portion 140 of the active layer 105 is illustrated by a dotted line. Hence, a part of the first electrode 109 and the active layer 105 is one element, wherein the active portion, or the contact portion 140, of the active layer 105 typically is defined by the interface area between the active layer and the solidified electrolyte 101. As schematically illustrated, the first electrode 109 and the second electrode 110 is connected via schematic electrodes to e.g. a circuit arrangement 130. The active portion is arranged spatially and electronically between the first electrode portion 109 and the covered portion 141 of said electrochemically active layer.

Figure 1C:
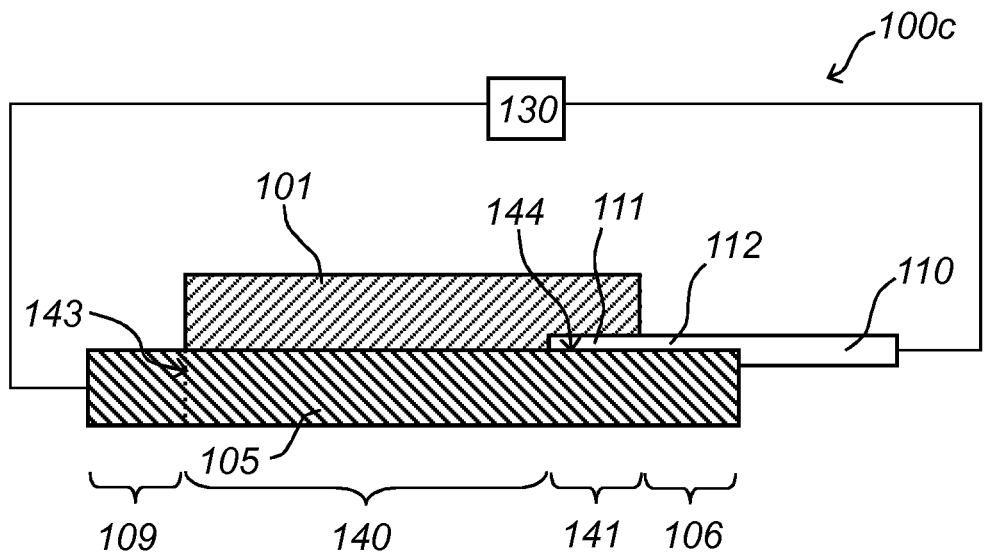

FIG. 1c illustrates an embodiment of the electrochemical device 100c which comprises the same features and a similar arrangement as described with relation to the electrochemical devices 100a and 100b. The electrochemical device of FIG. 1c differs from the embodiments illustrated in FIGS. 1a and 1b in that the active layer 105 of the electrochemical device 100c further comprises a first projecting portion 106 which extends from the covered portion 141 of the active layer 105. The first projecting portion 106 extends outside the solidified electrolyte 101, i.e. is not covered by electrolyte. In more detail, in a projection of the device normal to the layer of solidified electrolyte 101, the first projecting portion extends outside the solidified electrolyte 101. As further illustrated, the first covered portion 141 is arranged spatially and electronically between, and in direct contact with, the contact portion 140 and the first projecting portion 106. Furthermore, the second portion 112 of the second electrode 110 at least partly covers the projecting portion 106. Hence, the active layer 105 comprises a first projecting portion covered by the second portion 112 of the second electrode 110, a first covered portion 141 arranged in contact with the first portion 111 of the second electrode 110, a contact portion 140 which comprises an electrochemically active surface region in contact with the solidified electrolyte 101, and an extending portion forming, at least partly, the first electrode 109.

Figure 1D:
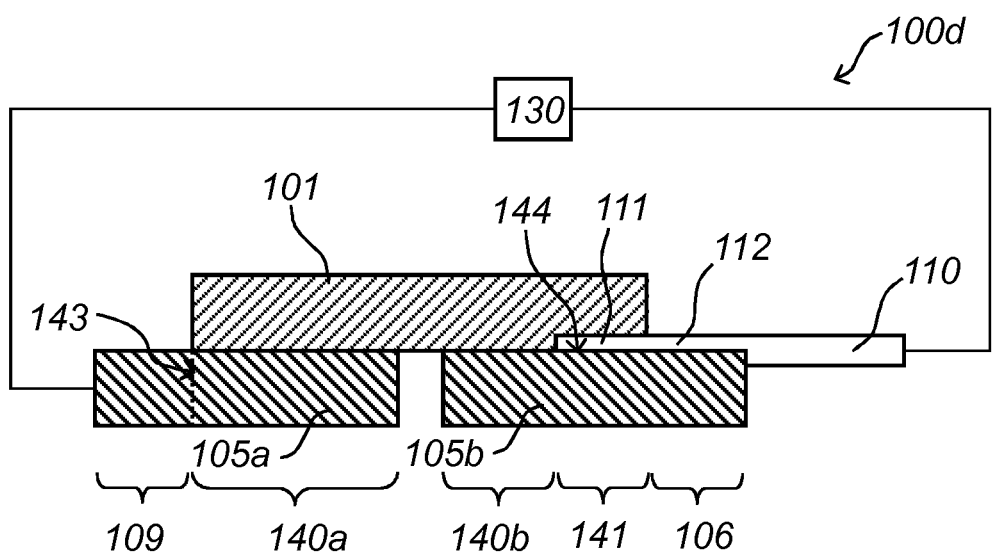

In FIG. 1d, an alternative embodiment of the electrochemical device is illustrated. The electrochemical device 100d is arranged in a lateral configuration and comprises a first and second active layer, 105a and 105b, which active layers comprise organic material having the ability of electrochemically altering its redox state. The first and second active layers, 105a and 105b, are spatially separated, arranged in a common plane, and are in direct, contact, or direct ionic contact, with a layer of solidified electrolyte 101. Each active layer contacts the solidified electrolyte 101 at a first and second contact portion, 140a and 140b, respectively. Thus, each active layer comprises a contact portion being in direct and/or ionic contact with the electrolyte such that an interface between the electrolyte and the electrochemically active element, which interface defines the extension of the said contact portions, as described in relation to the previous figures. Hence, two separate active layers, 105a and 105b, are laterally arranged relative each other and ionically connected, or bridged, by a layer of solidified electrolyte 101. One of the active layers, in this case the second active layer 105b, further comprises a first covered portion 141 which extends from the contact portion 140b. The layer of solidified electrolyte 101 covers, or extends across, the first covered portion 141, but the solidified electrolyte 101 and the first covered portion 141 of the active layer 105b are not in direct contact as electrolyte and the active layer are separated from each other by an electrode 110. Similarly, as described with reference to FIG. 1b, an extending portion of one of the active layer, in this case the first active layer 105a, forms a first electrode 109, which is further connected via a conducting path, such as an electrode, to e.g. a circuit arrangement 130, as schematically illustrated. The first electrode 109 is in direct electronic contact with a first region 143 of the first active layer 105a, wherein the interface between the first electrode 109 portion and the contact portion 140a of the first active layer 105a is illustrated with a dotted line, which dotted line indicates the first region 143. The electrochemical device 100d further comprises a second electrode 110 in direct electronic contact with a second region 144 of the second active layer 105b. Furthermore, the second electrode 110 comprises a first and second portion, 111 and 112, which portions comprise corrosion resistant material, and are arranged adjacent, or immediately next to, each other. As illustrated, only the first portion 111 of the first and second portions (111, 112) of the second electrode 110 is in contact with the solidified electrolyte 101, and the first portion 111 is arranged between the first covered portion and the solidified electrolyte 101. Hence, a portion that is the first portion 111, of the second electrode is sandwiched between a portion of the second active layer 105b and the solidified electrolyte 101. Accordingly, the second active layer 105b is provided with a suitable electrode according to the present invention. Furthermore, the second electrode may, as schematically illustrated, be arranged in a connection with e.g. a circuit arrangement 130, via electrodes, which electrodes may comprises a conductive path of e.g. conductive polymer or conductive metal.

In other words, FIG. 1d illustrates an electrochemical device 100d comprising a layer of solidified electrolyte 101, two electrochemically active layer 105a, 105b, wherein each active layer 105a, 105b comprises organic material having the ability of electrochemically altering its redox state, and each one of the two active layers 105a, 105b comprises a contact portion 140a, 140b in direct contact, or ionic contact, with the solidified electrolyte 101. Furthermore, one of the two active layers 105b further comprises a first covered portion 141 which extends from the contact portion 140b, and wherein the solidified electrolyte 101 covers, or extend across, the covered portion 141 and the contact portion 140b. The electrochemical device further comprises a first electrode 109 in direct electronic contact with a first region 143 of one of the two active layers 105a, a second electrode 110 in direct electronic contact with a second region 144 of one of the two active layers 105b. Moreover, a first portion 111 and second portion 112 of said second electrode 110 comprise corrosion resistant material, and only the first portion 111 of said first and second portion of the second electrode 110 is in direct contact with the solidified electrolyte 101, and wherein the first portion 111 of said second electrode 110 is arranged between the first covered portion 141 and the solidified electrolyte 101.

Figure 2A:
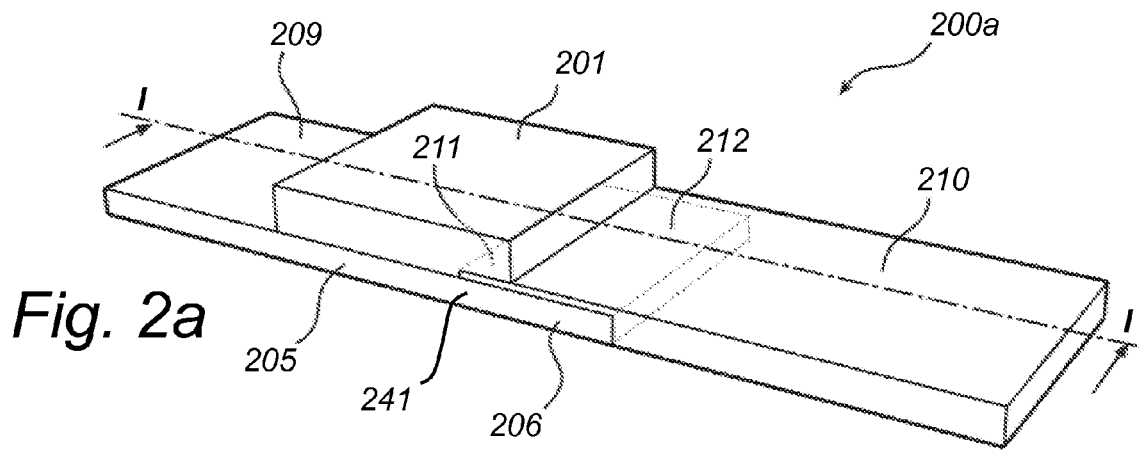
FIG. 2*a-b* are schematic perspective views of two embodiments of the electrochemical device.
Figure 2B:
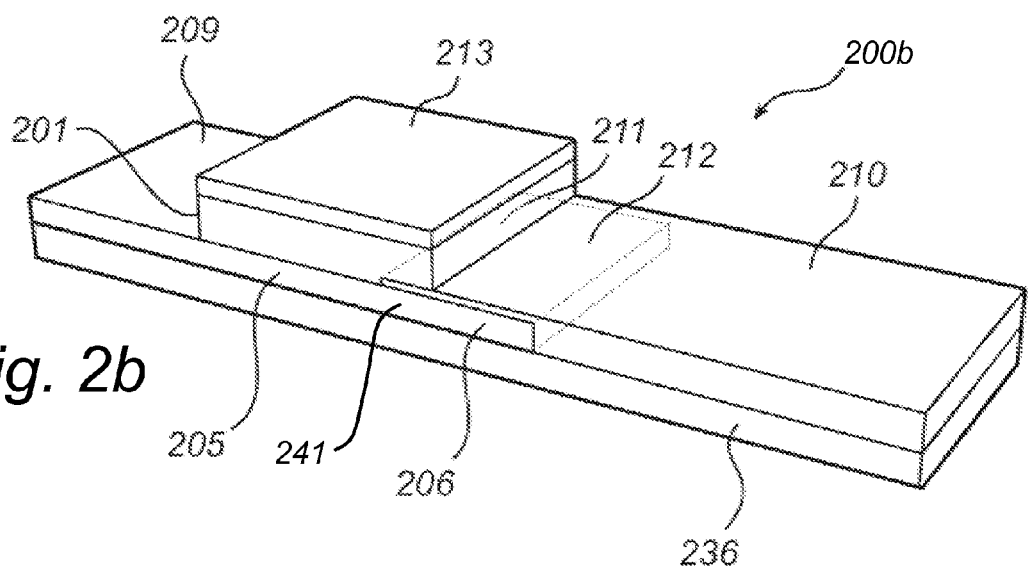

In FIG. 2a-b, perspective views of two embodiments of the electrochemical device are shown. In FIG. 2a and FIG. 2b the devices are based on and has similar features and arrangement as the electrochemical device 100c, as described with reference to FIG. 1c. A layer of solidified electrolyte 201 covers an active layer 205 comprising electrochemically active material, which active layer 205 has a first projecting portion 206. As described with reference to FIG. 1c, the active layer 205 comprises a contact portion at which contact portion the solidified electrolyte is in contact with the active layer 205. Moreover, a first covered portion 241 is arranged between the first projecting portion 206 and the contact portion of the active layer. The contact portion of the active layer 205 generally defines an active region, and the covered portion 241 extends from the contact portion. In turn, the first projecting portion 206 extends from the covered portion 241 of the active layer 205 in a first direction. The first direction is further illustrated in FIG. 2a by the line of dots and dashes, wherein the first direction is defined in a direction from reference numeral 209 towards reference numeral 210. The line of dots and dashes are also is used to indicated a cross-section I-I of the electrochemical device 200a. In FIG. 2a and FIG. 2b the electrochemical device 200a and 200b further comprise a first electrode 209 comprised of an extending portion of the active layer 205, which extends from the active region of the active layer 205 in an direction opposite to and parallel with the first direction, as illustrated. A second electrode 210 comprising a first portion 211 and a second portion 212 comprising corrosion resistant material, is provided. The first portion 211 and second portions 212 of the second electrode 210 are arranged in direct contact with the active layer 205, wherein the first projecting portion 206 of the active layer 205 is covered by the second portion 212 of the second electrode 210, and wherein the first portion 211 of the second electrode 210 is arranged between the solidified electrolyte 201 and the active layer 205.

As illustrated in FIG. 2b, the electrochemical device 200b is arranged as described in relation to FIG. 2a except that the device 200b further comprises a third electrode 213, which is in ionic contact with the solidified electrolyte 201, has a layered structure, and covers the solidified electrolyte 201 in a vertical arrangement. As illustrated, the solidified electrolyte 201 is arranged in a layered arrangement between the active layer 205 and the third electrode 213, and the third electrode 213 is geometrically separated from and not in direct contact with active layer 205. In the embodiment, the electrochemical device is arranged on a substrate 236, or carrier, which may comprise flexible material. The active layer 205 and portions of the second electrode 210 is laterally arranged on, and in contact with, the substrate 236. In more detail, and as illustrated, the second electrode 210 is partially arranged on the substrate 236 to the side of and in an overlapping arrangement with the active layer 205. The electrochemical device 200b may be arranged with a substrate, or carrier, in various configurations, and other arrangements other than those described here are contemplated. For example, the substrate 236 may instead be arranged in contact with the third electrode 213 and/or the second electrode 210. Also, isolating layers, or lacquer, may be utilized in order to achieve various structural designs, or arrangements, of the electrochemical device on a substrate, or carrier.

With reference to FIG. 1a-d and FIG. 2a-b, the second electrode 110 and 210 may extend further and be connect in a circuit arrangement or be connected to a an additional electrode. By forming the second electrode, 110 and 210, of a material comprising corrosion resistant material having higher electrical conductivity than the electrochemically active material, the configuration of the electrochemical device in circuit systems, such as printed electronic systems, may be facilitated. For example, the electrical conductivity and efficiency of the electrochemical device may be increased, wherein the resistance of the electrodes of the electrochemical device and undesired power loses may be reduced. Furthermore, the corrosion resistant material allow for less degradation of the electrochemical material, such as electrochemical polymers, which results in an increased durability of the electrochemical device and a longer working life.

Figure 3:
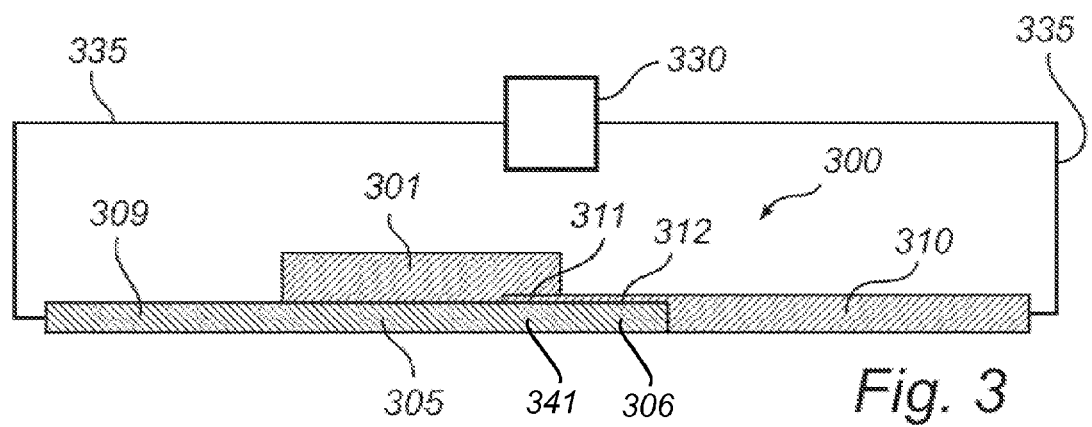
FIG. 3 is a cross-sectional view of an embodiment of the electrochemical device.

FIG. 3 illustrates a cross-sectional view of an embodiment of the electrochemical device 300 arranged as described with reference to FIG. 1c and FIG. 2a, with the same arrangement as the electrochemical device 200a taken along cross-section I-I in FIG. 2a. A solidified electrolyte 301 is arranged in contact with and covers an active layer 305, wherein a first portion 311 of a second electrode 310 is arranged between the solidified electrolyte 301 and the active layer 305. The device 300 is arranged in connection with the schematic circuit arrangement 330 preferably comprising a power source, an energy harvesting antenna, or a controller. The circuit 330 is connected to the first and second electrodes 309 and 310 by means of electrodes represented by electrode lines 335.

Figure 4:
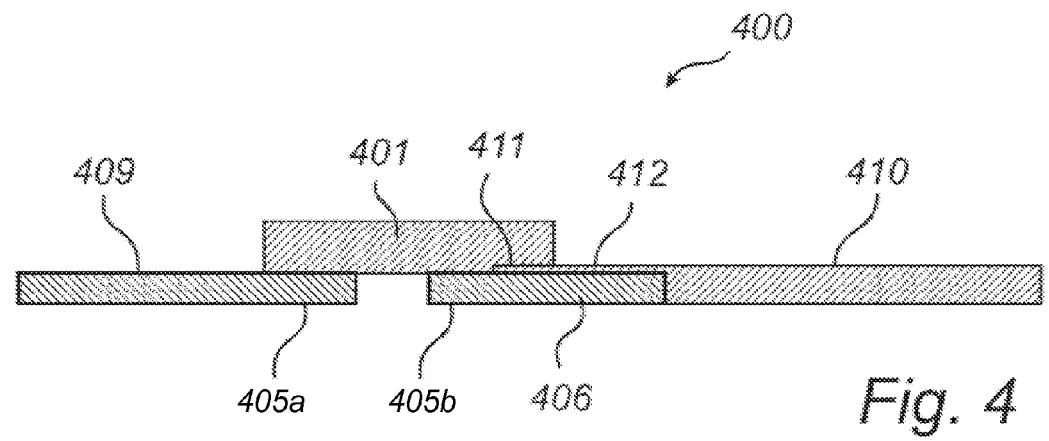
FIG. 4 is a cross-sectional view of an embodiment of the electrochemical device.

In FIG. 4, a cross-sectional view of the electrochemical device 400 according to an embodiment is shown. Similar features and arrangement as described with reference to the electrochemical device 100d and FIG. 1d, apply. In this embodiment a first active layer 405a and a separate second active layer 405b each has a contact portion in direct contact with a layer of solidified electrolyte 401, wherein the first active layer 405a comprises a first electrode 409 which is formed of an extending portion of the first active layer 405a. The layer of solidified electrolyte 401 is arranged on and covers the contact portions of the first and second active layer 405a, 405b, such that the solidified electrolyte 401 ionically connects the first active layer 405a and the second active layer 405b. In other words, the solidified electrolyte 401 bridges the first active layer 405a and the second active layer 405b, in a lateral arrangement. However, the solidified electrolyte 401 may also ionically connect the first active layer 405a and the second active layer 405b in a vertical arrangement, wherein the solidified electrolyte 401 is sandwiched between the first active layer and the second active layer 405. The first and second active layers 405a, 405b may comprise organic material having the ability of electrochemically altering its redox state, wherein the first electrode 409 may comprise similar, or the same, electrochemical material as the electrochemically active layer. The electrochemical device 400 further comprises a first projecting portion 406 of the second active layer 405b, which first projecting portion 406 extends outside the solidified electrolyte in a first direction. The first electrode 409 extends in a second direction and in direct electronic contact with the first active layer 405a, wherein the architecture of the electrochemical device 400 is of a lateral type. A second electrode 410 having a first portion 411 and a second portion 412 is arranged to the electrochemical device 400, wherein the second portion 412 covers the first projecting portion 406 of the second active layer 405b, and wherein the first portion 411 is arranged between, or sandwiched between, the solidified electrolyte 401 and the second active layer 405b in a layered arrangement. The electrochemical device 400 may, as described with reference to FIG. 3, be arranged in, or connected to, a circuit arrangement, wherein, in an embodiment, the first electrode 409 and the second electrode 410 is connected to additional electrodes or circuit elements, as described in relation to the electrochemical device 300, and with reference to FIG. 3.

Figure 5:
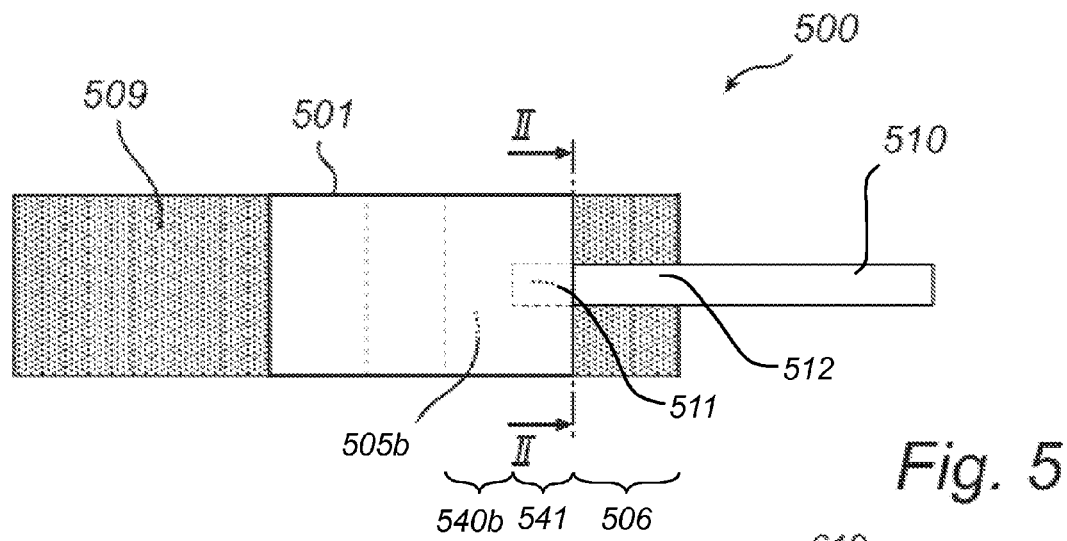
FIG. 5 is a top view of an embodiment of the electrochemical device shown in FIG. 4.

FIG. 5 illustrates a top view of an embodiment of the electrochemical device 500 as described with reference to FIG. 1d and FIG. 4, wherein the device 500 is elongated, or bandshaped, and extends in a longitudinal direction. The longitudinal direction is defined by the arrows in FIG. 5. There are provided a first electrochemically active layer and a second electrochemically active layer 505b, wherein the first and second active layers are separated from each other, and wherein a first electrode 509 is formed of an extending portion of the first active layer. Solidified electrolyte is in direct contact with a contact portion of said first active layer and contact portion 505b of said second active layer. Further, solidified electrolyte 501 covers the contact portion of the second active layer 505b and a first covered portion of the second active layer 505b. The first electrode 509 extends in an opposite longitudinal direction, parallel with the longitudinal direction, from a first region, which first region defines the interface between the first electrode 509 portion of the first active layer and the contact portion of the first active layer. The electrochemical device 500 further comprises a first projecting portion of the second active layer 505b which extends in first direction parallel to the elongated direction. As illustrated, a second electrode 510 comprises a first portion 511 which is arranged between the second active layer 505b and the solidified electrolyte 501, and a second portion 512 which covers the first projecting portion of the second active layer 505b, is provided. Hence, the second electrode 510 is in electronic contact with the second active layer 505b and is geometrically separated from first active layer and the first electrode 509. Furthermore, the second electrode 510 is elongated, or bandshaped, and extend from the second active layer 505b in the same direction as the first portion 506, parallel to the longitudinal direction of the device 500, i.e. the first direction. The device 500 is further arranged such that, in a cross-section II-II, the width of the second electrode 510 is at least 1%. or at least 5%, of the width of the second active layer 505b and/or first active layer. The electrode may also be wider such that is covers 95% of the whole width of the second active layer. The cross-section II-II is taken along a second direction which is orthogonal, or at least having an orthogonal component, relative the longitudinal direction of the electrochemical device. Moreover, along cross-section II-II, the width of the second electrode 510 is at least 1%. or at least 5%, of the width of the layer of solidified electrolyte 501.

Figure 6:
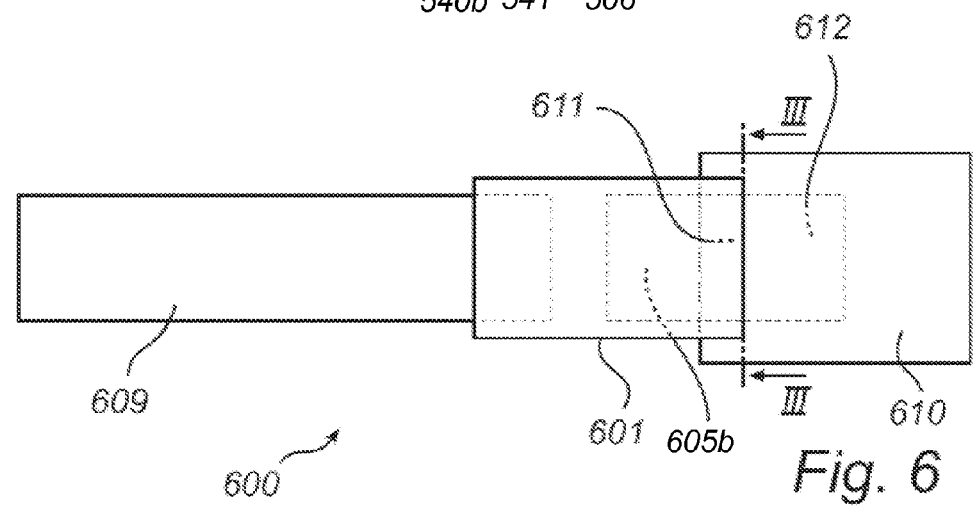
FIG. 6 is a top view of an embodiment of the electrochemical device.

According to yet an embodiment illustrated in FIG. 6, the electrochemical device 600 is arranged as to the electrochemical device 500, as described with reference to FIG. 5.

Furthermore, the electrochemical device 600 is arranged such that, in a cross-section III-III which is taken along the above-mentioned second direction, orthogonal to the elongated direction of the electrochemical device, the width of the second active layer 605 and/or the width of the solidified electrolyte 601 is less than the width of the second electrode 610. As illustrated in FIG. 5 and FIG. 6, the cross-sections II-II and III-III comprise the second portions 512 and 612 of the second electrode, respectively, and are taken immediately at the interface between the first portions (511; 611) and the second portions (512; 612) of the second electrode.

Both embodiments of the electrochemical device 500 and 600 may, as described with reference to FIG. 3, be arranged in, or connected to, a circuit arrangement, wherein, in an embodiment, the first electrode, 509 or 609, and the second electrode, 509 or 609, respectively, is connected to additional electrodes or circuit elements.

Figure 7:
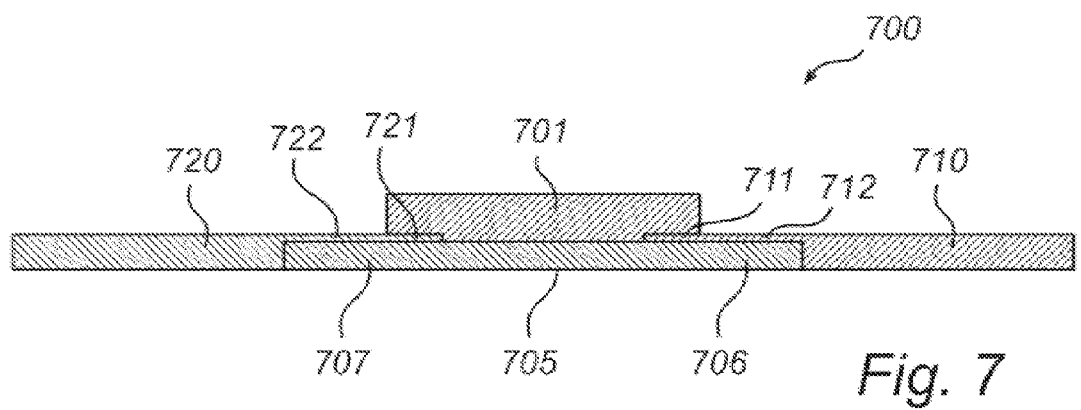
FIG. 7 is a cross-sectional view of an embodiment of the electrochemical device having two separated electrodes of corrosion resistant material.

FIG. 7 illustrates a cross-sectional view of an embodiment of electrochemical device 700. The device 700 is arranged with similar features and in a similar arrangement as the electrochemical device 100d as described with reference to FIG. 1c. Accordingly, a second electrode 710 having first portion 711 and second portions 712, a solidified electrolyte 701, and an active layer 705 having a first projecting portion 706 extending in a first direction, are provided. The active layer 705 of the electrochemical device 700 is further arranged with an second covered portion and a second projecting portion 707. The second projecting portion 707 extends in a direction opposite the first direction, wherein the second covered portion is arranged between the second projecting portion 707 and a contact portion of the active layer. Hence, the first projecting portion 706 and the second projecting portion 707 form, together with the rest of the active layer 705, a continuous piece of material. As illustrated, the device 700 is also arranged with a first electrode 720 in electrical contact with the active layer 705, wherein the first electrode 720 extends outside, or further than the active layer 707, along the opposite direction. In the embodiment, the first electrode 720 comprises corrosion resistant material which has a first portion 721 which is arranged between the active layer 705 and the solidified electrolyte 701. In more detail, the first portion 711 is arranged between a second covered portion of the active layer and the solidified electrolyte 701. Moreover, the first electrode comprises a second portion 722 which covers, or overlaps, the second projecting portion 707 of the active layer 705. Hence, the device 700 is arranged with a first electrode 710 and a second electrode 720 of similar configuration.

Figure 8:
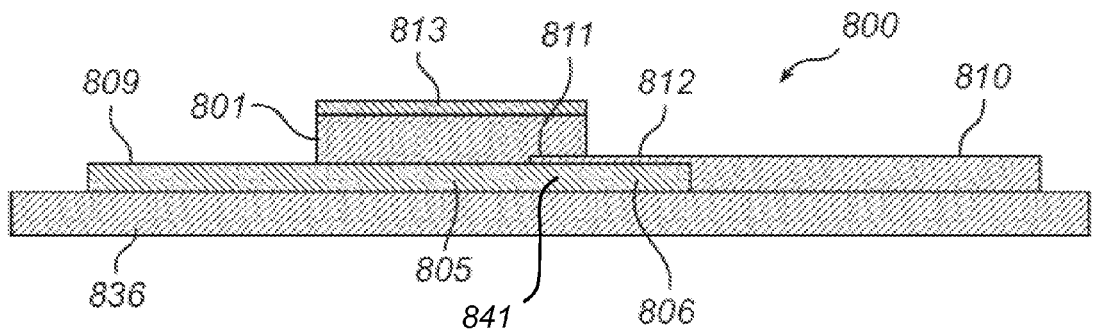
FIG. 8 is a cross-sectional view of a vertical embodiment of an electrochemical transistor device, wherein the device is arranged on carrier substrate.

FIG. 8 illustrates a cross-sectional view of an embodiment of an electrochemical transistor device 800 which comprises the same features and arrangement as described with reference to the electrochemical device 100c, in FIG. 1c, and the electrochemical device 200b, in FIG. 2b. The transistor device is arranged of a solidified electrolyte 801 which is provided in a vertical architectural configuration in contact with, and covering a contact portion of, an active layer 805. As described with reference to FIG. 1c, the active layer 805 comprises organic material having the ability of electrochemically altering its redox state. The active layer 805 further comprises material having the ability of electrochemically altering its conductivity through change of redox state thereof. For example, the active layer 805 may be formed of a conductive polymer material, or other suitable electrochemically active material. A portion of active layer 805 forms a first electrode 809 of the transistor device 800, wherein the first electrode 809 is in contact with the a first region of the active layer 805. A second electrode 810 comprising corrosion resistant material is arranged in contact with a second region of the the active layer 805, wherein the second electrode has a first portion 811 and a second portion 812 which are arranged as described with reference FIG. 1c. The first electrode 809 and the second electrode 810 are geometrically separated but are electronically connected through the active layer 805. Hence, the active layer 805 forms a electronic path, or connection, between the first and second electrode, wherein the conductivity of the path, or connection, is responsive to, and controllable by, the redox state of the electrochemically active layer 805. As illustrated in FIG. 8, the transistor device 800 is further arranged with a third electrode 813 in ionic contact with the solidified electrolyte 801 and geometrically separated from the active layer 805. The third electrode 813 covers the solidified electrolyte 801 in a vertical arrangement and forms thereby a gate electrode to the transistor device 800. Hence, in more detail, the active layer 805 realizes an electrical connection between the first electrode 809 and the second electrode 810, wherein the conductivity of the electrical connection is controllable by means of applying a potential difference between the third electrode 813 and at least one of the first electrode 809 or second electrode 810. By applying the potential difference, an electrochemical reaction in the active layer is initiated. The electrochemical reaction alters the redox state of the active layer 805 such that conductivity of the transistor device 800 is controllable by controlling the potential difference. As further illustrated, the transistor device 800 is arranged on substrate 836, wherein, in the embodiment, the active layer 805 and the second electrode 810 is in contact with the substrate 836.

Figure 9:
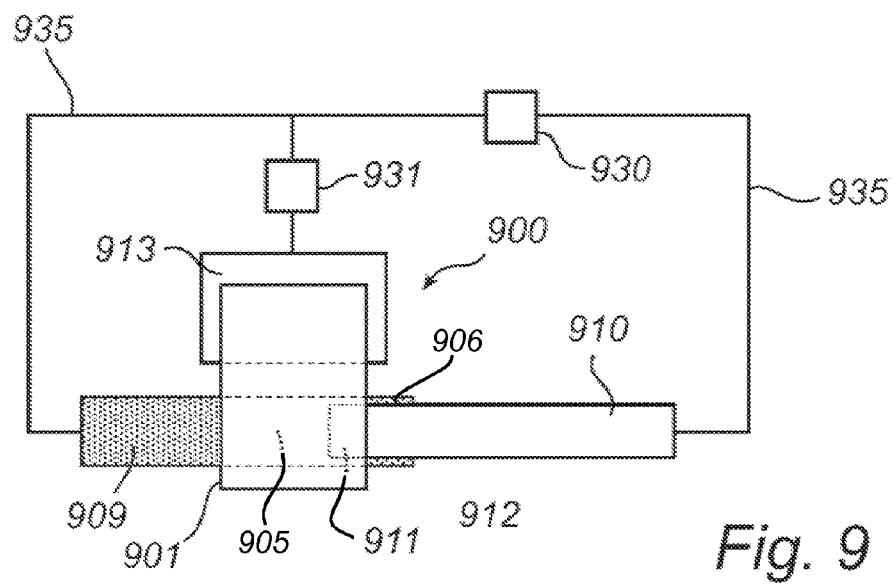
FIG. 9 is a top view of a vertical embodiment of an electrochemical transistor device according to the present invention, which device is in an exemplifying circuit arrangement.

In FIG. 9, a top view of a lateral embodiment of an electrochemical transistor device is shown with the same features and arrangement as described with reference to the transistor device 800, in FIG. 8, but wherein the third electrode is arranged differently. Therefore, an active layer 905 electronically connects a first electrode 909 and a second electrode 910 with similar arrangement as described with reference to FIG. 8. In a lateral embodiment, a third electrode 913 is arranged to the side of and geometrically separated from the active layer 905, compared to in a vertical arrangement in which the active layer and third electrode is stacked, as illustrated in FIG. 8. A solidified electrolyte 901 is arranged in ionic contact with and covers a portion of the active layer 905, and is further in ionic contact with the third electrode 913. Hence, the solidified electrolyte 901 ionically bridges, or ionically connects, the active layer 905 and the third electrode 913 in a lateral arrangement. Thereby, controlling of the electrochemical redox state of the active layer 905 is provided by controlling a potential difference applied to the third electrode 913 and at least one of the first electrode 909 and the second electrode 910. The potential difference between the 909, 910, and 913 electrodes may be varied by power sources, or electrical controllers, 930 and 931. Alternatively, the power sources 930 and 931 may also represent circuit arrangements in which the transistor device 900 is connected. Further electrodes, schematically represented by the electrode lines, may be used to connect the first 909, second 910, and third 913 electrodes of the transistor device with power sources or in a circuit arrangement. Hence, an electrode connected to the the active layer 905 may comprise different portions. For example, an electrode of the electrochemical device comprise a portion of the active layer 905 itself, a corrosion resistant electrode portion such as 910, and an conventional electrode 935, which portions together are connected to form a single electrical path from e.g. a power source 930 to the active layer 905. As illustrated in FIG. 9, the second electrode 910 is arranged such that a second portion 911 is arranged between the solidified electrolyte 901 and the active layer 905. The second electrode 910 is also arranged with a first portion 912 which covers an extending portion 906 of the active layer 905. With reference to FIG. 9, some portions and features of the electrochemical device 900, such as portions of the active layer 905 including the first extending portion 906, is covered by e.g. the solidified electrolyte 901, and are therefore illustrated as being behind the solidified electrolyte 901.

Figure 10:
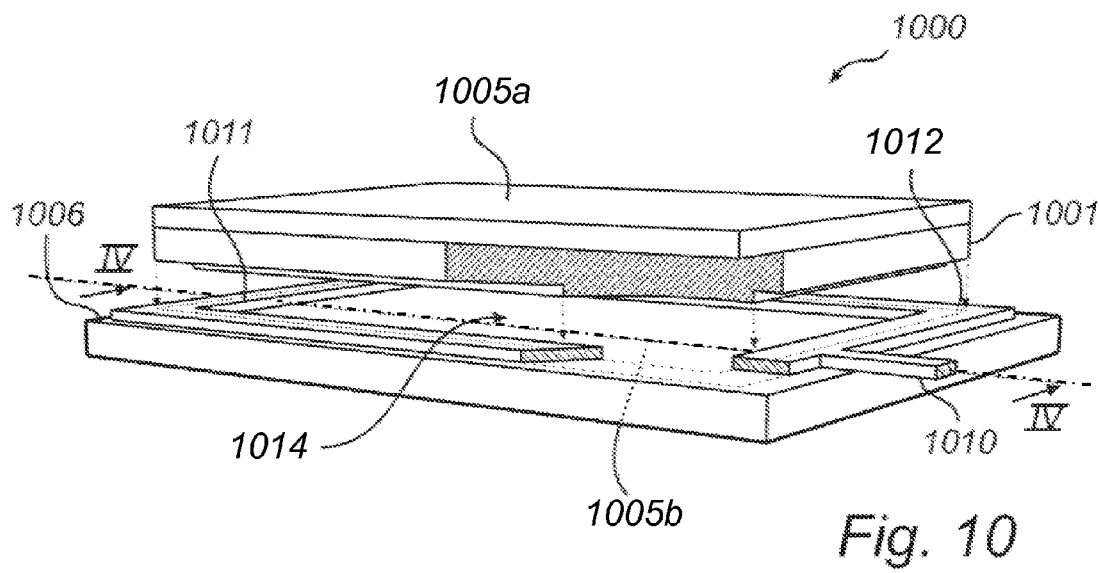
FIG. 10 is a schematic perspective view of an embodiment of an electrochemical display device according to the present invention.

FIG. 10 illustrates an embodiment of the electrochemical device 1000 wherein a first electrochemically active layer 1005a is covered by a layer of solidified electrolyte 1001. The solidified electrolyte 1001 is in turn, in a vertical arrangement, covered by a second active layer 1005b comprising organic material having the ability of electrochemically altering its redox state. The second active layer 1005b comprises electrochemically active material which may have the ability of electrochemically altering its conductivity and/or comprise electrochromic material. For example, the material may be a polymer material. A first electrode may accordingly be provided in contact with the first active layer 1005a, but is not illustrated. A second electrode 1010 comprising corrosion resistant material is provided, wherein a portion of the second electrode 1010 is arranged on, and in contact with, the second active layer 1005b in a frame arrangement, wherein the electrode 1010 encloses an open area 1014 of the second active layer 1005b. In more detail, and as illustrated, a first portion 1011 of the second electrode 1010 encloses the open area 1014 which defines the interface area, or contact portion, between the second active layer 1005b and the solidified electrolyte 1001. Accordingly, the second electrode 1010 is arranged with a first portion 1011 and second 1012 portion, where in the first portion 1011 of the second electrode 1010 is arranged between the second active layer 1005b and the solidified electrolyte 1001. In more detail, only the first portion 1011 of the first and second portions of the second electrode (1011, 1012) is contact with solidified electrolyte 1001, and the first portion 1011 is arranged between a first covered portion of the second active layer 1005 and the solidified electrolyte. For illustrative purposes, a corner of the solidified electrolyte 1001 and a portion of the second electrode 1010 is cut out from FIG. 10.

In an embodiment, the electrochemical device illustrated in FIG. 10 wherein said first and/or second active layer, 1005a and/or 1005b, comprises electrochromic material, wherein the electrochemical device 1000 forms an electrochromic pixel element, or electrochromic display. The electrochromic material typically has the ability of electrochemically alter its color through change of redox state. Hence, a color change of the active layer may be achieved and controlled e.g. by applying a potential difference between the first and second active layer, 1005a and 1005b, via the first (not shown) and second electrode 1010.

Figure 11:
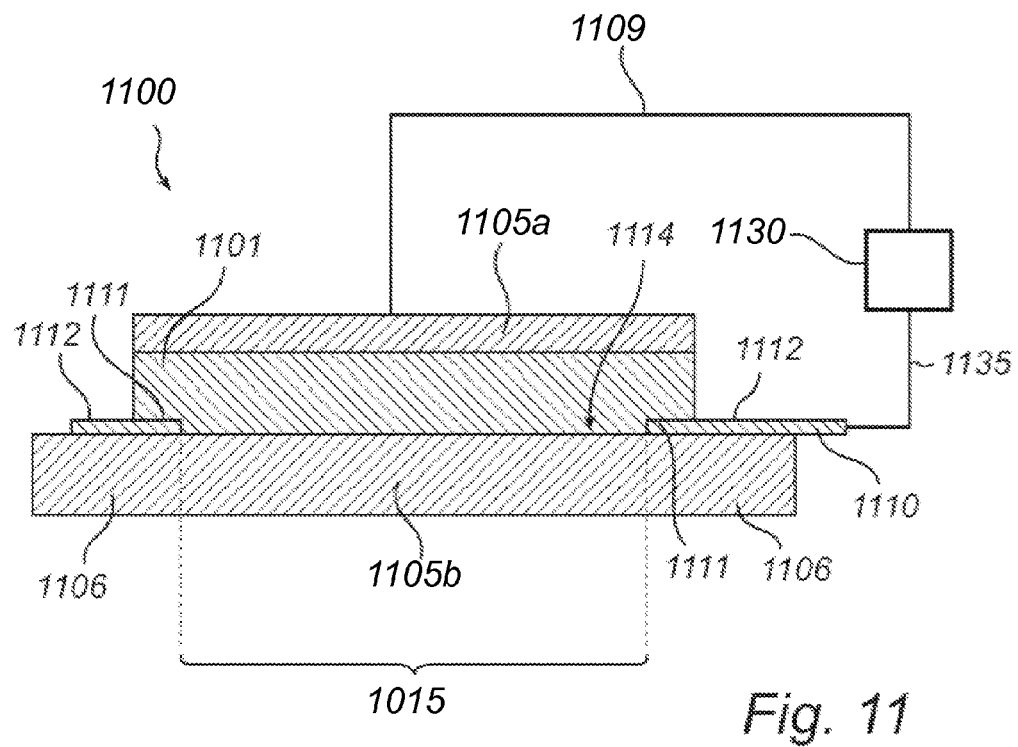
FIG. 11 is a cross-sectional view of an embodiment of an electrochemical display device according to the present invention.

In FIG. 11, a cross-sectional view of the embodiment of the electrochemical pixel element 1100, or electrochromic display, as described in relation to FIG. 10 is shown. In the figure, a second active layer 1105b is arranged at the bottom, comprises electrochromic material, and is arranged with a second electrode 1110. The second electrode 1110 comprises corrosion resistant material and has a second portion 1112, which covers extending portions 1106 of the active layer 1105, and a first portion 1111, which is arranged between a layer of solidified electrolyte 1101 and the second active layer 1105b. As illustrated, the first portion 1111 of the second electrode encloses an open area which is indicated by 1114 in FIG. 11. The open area 1114 defines the complete interface area 1115, or contact portion, between the solidified electrolyte 1101 and the second active layer 1105b, and may be arranged in different shapes, such as rectangular, annular, bandshaped, or figure shaped. Hence, pixel and display elements that have various shapes, or forms, may be realized. As illustrated, the electrochromic pixel element 1100 is connected in a circuit comprising a controlled device 1030 and conventional electrodes, or electrical connection means, 1135.

Figure 12A:
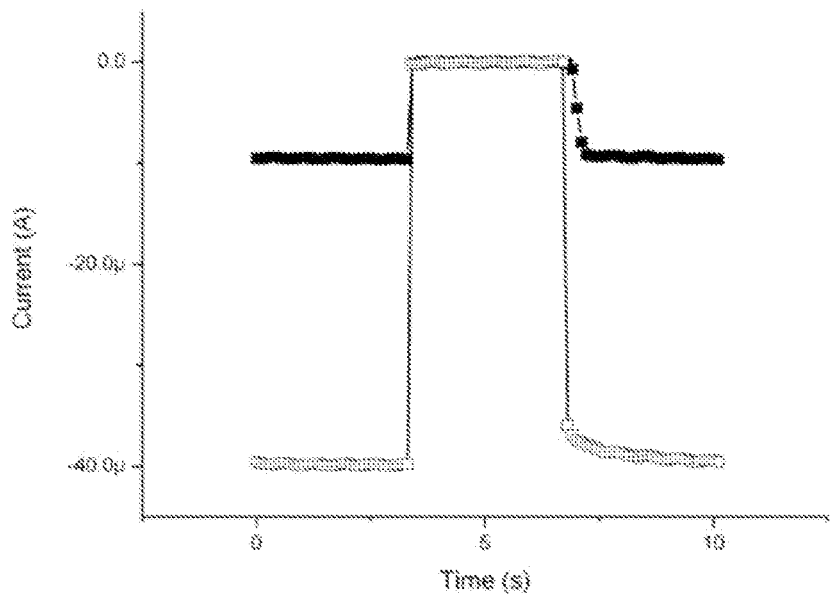
FIGS. 12a-d are graphs illustrating the effect of using a corrosion resistant material according to the invention.
Figure 12B:
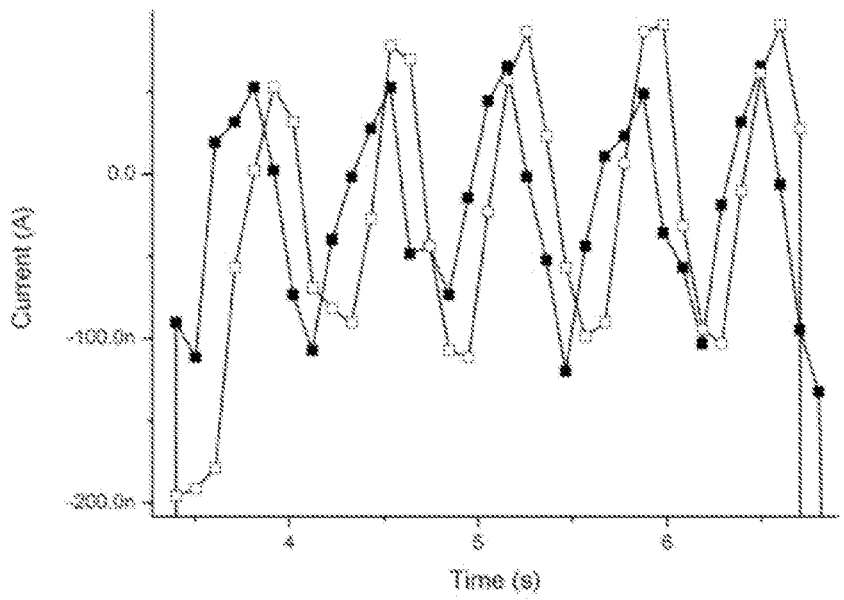
Figure 12C:
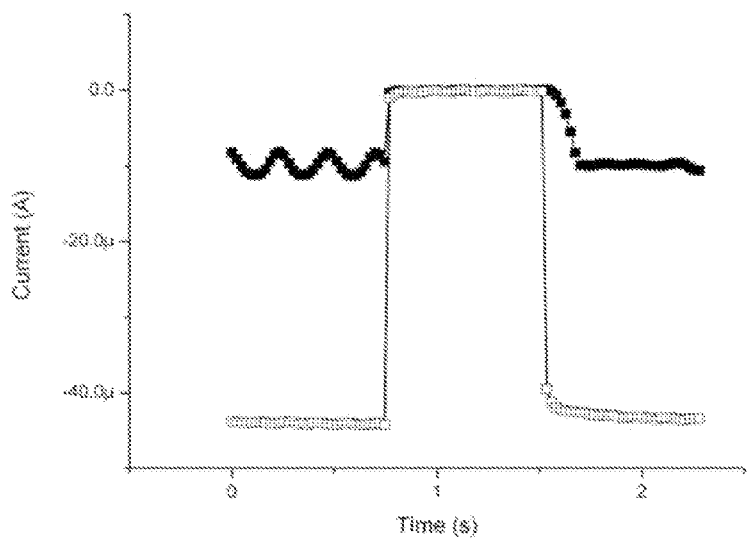
Figure 12D:
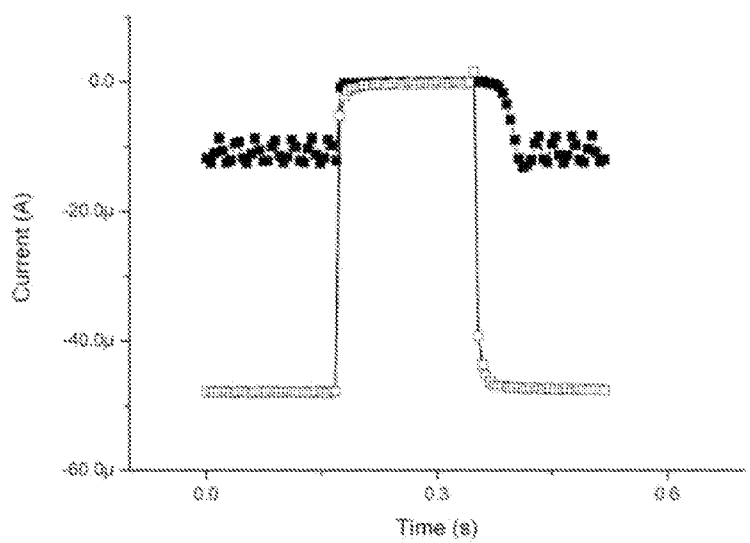

FIGS. 12a-d. The graphs demonstrate the improved switching characteristics achieved by the invention. The open squares denote a transistor device according to an embodiment illustrated in FIG. 8, that is, where carbon is used as a corrosion resistant drain electrode 810 in combination with an active layer of PEDOT:PSS 805. The filled squares denote a transistor device according to an embodiment in which only an active layer 805 comprising PEDOT:PSS is present, that is, no corrosion resistant material is available. In more detail, first an active layer 805 consisting of PEDOT:PSS Clevios SV3 screen printing paste was screen printed onto a polyester (PET) substrate and then thermally cured at 110° C. for five minutes. Then an electrode 810 comprising carbon material (DuPont 7102 screen printing paste) was deposited by screen printing in the device corresponding to the open squares. An electrolyte layer 801 was then deposited such that it defines an active transistor channel within the active layer 805. The electrolyte layer also covers the portion 811 in the embodiment corresponding to the graph denoted by open squares. The active area, that is, the transistor channel area, is on the order of 400×400 $\mu m^2$ in both transistor devices. The electrolyte in this particular experiment consisted of an ionic liquid, but similar results have been obtained by using both polycationic and polyanionic electrolytes. The gate voltage was cycled between 0 and 1 V in this measurement, where 1 V corresponds to a transistor channel switched to its off-state, and the voltage between the two electrodes was constantly set to −1 V. The time interval between two data points is 103/23/5 ms in FIG. 12a, 12c and 12d, respectively. FIG. 12a shows that the off-to-on switching event takes ~300 ms in the device without corrosion resistant material, while the switching event occurs in less than 100 ms in the device comprising corrosion resistant material. FIG. 12b shows that the two different transistor devices results in similar off-current levels, i.e. no stray electrochemical reactions seem to occur. FIG. 12b is based on the same data shown in FIG. 12a. FIG. 12c shows that the off-to-on switching event takes ~120 ms without corrosion resistant material, while the switching event takes less than 20 ms in the device comprising corrosion resistant material, and the same trend is illustrated in FIG. 12d; the switching time is at least five times shorter when the corrosion resistant material is used as one of the electrodes. The difference in on-current levels can be explained by that the channel length of the transistor device including corrosion resistant material is three times shorter as compared to the transistor device without corrosion resistant material, which results in higher current throughput. It should also be noted that the different pulse lengths applied by the gate electrode and reflected in FIGS. 12a, 12c and 12d, respectively, result in different switching times, especially in the transistor device without corrosion resistant material. The gate voltage is applied for several seconds in FIG. 12a, while the gate voltage only is applied during less than 200 ms in FIG. 12d. Hence, the electrochemical reaction adds more strain on the transistor device in FIG. 12a, which explains the long switching time when switching the transistor channel from off-to-on.

The invention has mainly been described above with reference to a number of explicitly disclosed embodiments. However, as is readily appreciated by the skilled person in the art, embodiments other than the ones disclosed above are equally possible within the scope of the invention, as defined by the appended claims.

The invention claimed is:

1. An electrochemical device comprising
a layer of solidified electrolyte,
at least one electrochemically active layer, wherein each active layer comprises organic material having the ability of electrochemically altering its redox state, and each one of said at least one active layer comprises a contact portion in direct contact with said solidified electrolyte, and one of said at least one active layer further comprises:
a first covered portion which extends from said contact portion,
and wherein said solidified electrolyte covers said covered
portion and said contact portion,
a first electrode in electronic contact with a first region of one of said at least one active layer,
a second electrode in electronic contact with a second region of one of said at least one active layer,
wherein a first portion and second portion of said second electrode comprise corrosion resistant material,
only said first portion of said first and second portion of said second electrode is in direct contact with said solidified electrolyte, and
said first portion of said second electrode is arranged between said first covered portion and said solidified electrolyte.

2. An electrochemical device according to claim 1, which is arranged on a flexible substrate.

3. An electrochemical device according to claim 1, wherein said second electrode is elongated and extends in a first direction.

4. An electrochemical device according to claim 3, wherein, in a cross-section (II-II) of said electrochemical device taken along a second direction orthogonal to said first direction, the width of said second electrode is at least 1% of the width of said active layer which comprises said first covered portion.

5. An electrochemical device according to claim 3, wherein, in a cross-section (III-III) of said electrochemical device taken along a second direction orthogonal to said first direction, the width of said second electrode is at least b 1% of the width of said solidified electrolyte.

6. An electrochemical device according to claim 1, wherein said cross-section comprises said second portion of said second electrode and is taken adjacent an interface between said first and second portion of said second electrode.

7. An electrochemical device according to claim 1, wherein the active layer which comprises said first covered portion further comprises a first projecting portion extending from said covered portion,
wherein said first covered portion is arranged between and in direct contact with said contact portion and said first projecting portion, and
said second portion of said second electrode at least partly covers said first projecting portion.

8. An electrochemical device according to claim 1, wherein said second portion of said second electrode encloses an open area which defines an interface area between said solidified electrolyte and the active layer which comprises said first covered portion.

9. An electrochemical device according to claim 1, wherein said second electrode is arranged as a layer.

10. An electrochemical device according to claim 1, wherein
one of said at least one electrochemically active layer comprises a second covered portion, which second covered portion extends from said contact portion of said one of said at least one electrochemically active layer,
a first portion and a second portion of said first electrode comprise corrosion resistant material, wherein
only said first portion of said first and second portion of said first electrode is in contact with said solidified electrolyte, and
said first portion of said first electrode is arranged between said second covered portion and said solidified electrolyte.

11. An electrochemical device according claim 1, wherein said corrosion resistant material is selected from a group comprising: carbon, gold, titanium, platinum, conducting form of carbon, graphite, graphene, noble metal or inert metal.

12. An electrochemical device according to claim 1, wherein said organic material comprises a conductive polymer material.

13. An electrochemical device according to claim 1, wherein the active layer which comprises said first covered portion further comprises material having the ability of electrochemically altering its electrical conductivity through change of redox state thereof.

14. An electrochemical transistor device comprising an electrochemical device according to claim 13, wherein said first region and said second region are two separate regions of said active layer which comprises said first covered portion,
which electrochemical device further comprises a third electrode in ionic contact with said solidified electrolyte and separated from said active layer which comprises said first covered portion,
wherein said active layer which comprises said first covered portion electronically connects said first and second electrodes.

15. A circuit comprising an electrochemical device according to claim 1, and
an electrical power source,
wherein said first and second electrodes are connected to said power source.

16. An electrochemical device according to claim 1, wherein one of said at least one active layer comprises electrochromic material.

17. An electrochromic pixel element comprising an electrochemical device according to claim 16.

18. A circuit comprising an electrochromic pixel element according to claim 17, and
an electrical power source,
wherein said first and second electrodes are connected to said power source.

19. An electrochemical device according to claim 3, wherein, in a cross-section (II-II) of said electrochemical device taken along a second direction orthogonal to said first direction, the width of said second electrode is at least 5% of the width of said active layer which comprises said first covered portion.

20. An electrochemical device according to claim 3, wherein, in a cross-section (III-III) of said electrochemical device taken along a second direction orthogonal to said first direction, the width of said second electrode is at least 5% of the width of said solidified electrolyte.

21. An electrochemical device comprising
a layer of solidified electrolyte,
an electrochemically active layer comprising organic material having the ability of electrochemically altering its redox state,
and which active layer comprises:
a contact portion in direct contact with said solidified electrolyte and
a first covered portion which extends from said contact portion,
a first electrode in electronic contact with a first region of said active layer,
a second electrode in electronic contact with a second region of said active layer,
wherein a first portion and second portion of said second electrode comprise corrosion resistant material, wherein only said first portion of said first and second portion of said second electrode is in contact with said solidified electrolyte, and is arranged between said first covered portion and said solidified electrolyte.

22. An electrochemical device comprising
a layer of solidified electrolyte
a first and a second electrochemically active layer comprising organic material having the ability of electrochemically altering its redox state, which first and second active layer are spatially separated from each other and each comprise a respective first and second contact portion in direct contact with said solidified electrolyte,
wherein said second active layer further comprises a covered portion which extends from said second contact portion,
a first electrode in electronic contact with a first region of said first active layer,
a second electrode in electronic contact with a second region of said second active layer,
wherein a first portion and second portion of said second electrode both comprise corrosion resistant material, wherein
only said first portion of said first and second portion of said second electrode is in direct contact with said solidified electrolyte, and is arranged between said covered portion and said solidified electrolyte.

* * * * *